United States Patent
Miller et al.

(10) Patent No.: US 6,545,385 B2
(45) Date of Patent: Apr. 8, 2003

(54) MICROELECTROMECHANICAL APPARATUS FOR ELEVATING AND TILTING A PLATFORM

(75) Inventors: Samuel Lee Miller, Albuquerque, NM (US); Paul Jackson McWhorter, Albuquerque, NM (US); Murray Steven Rodgers, Albuquerque, NM (US); Jeffry J. Sniegowski, Edgewood, NM (US); Stephen M. Barnes, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/827,858

(22) Filed: Apr. 5, 2001

(65) Prior Publication Data

US 2001/0048265 A1 Dec. 6, 2001

Related U.S. Application Data

(60) Provisional application No. 60/196,622, filed on Apr. 11, 2000.

(51) Int. Cl.[7] .............................. H02N 1/00; G02B 26/08
(52) U.S. Cl. ..................... 310/309; 359/290; 359/291
(58) Field of Search ..................... 310/40 MM, 309; 257/415, 420; 359/290, 291, 871

(56) References Cited

U.S. PATENT DOCUMENTS 5,245,464 A * 9/1993 Jensen ..................... 359/224

(List continued on next page.)

OTHER PUBLICATIONS

A.Q. Liu, X.M. Zhang and Y.L. Lam, "A 4×4 MEMS Optical Crossconnections (OXCs)," Presented at the Micromachining and Microfabrication Conference, Nov. 28–30 2000, Singapore, in *Proceedings of the SPIE*, vol. 4230, pp. 174–179.

Patent application 09/366505, Aug. 1999, "MEMS Ratchet Apparatus".

Provisional application 60/196622, Apr. 2000, "Apparatus to Position Platform".

E.J. Garcia, "Micro–Flex Mirror and Instability Actuation Technique," Presented at the 11th IEEE Workshop on Micro Electro Mechanical Systems (MEMS 98), Heidelberg, Germany, Jan. 25–29, 1998.

*Primary Examiner*—Karl Tamai
(74) *Attorney, Agent, or Firm*—John P. Hohimer

(57) ABSTRACT

A microelectromechanical (MEM) apparatus is disclosed which has a platform that can be elevated above a substrate and tilted at an arbitrary angle using a plurality of flexible members which support the platform and control its movement. Each flexible member is further controlled by one or more MEM actuators which act to bend the flexible member. The MEM actuators can be electrostatic comb actuators or vertical zip actuators, or a combination thereof. The MEM apparatus can include a mirror coating to form a programmable mirror for redirecting or switching one or more light beams for use in a projection display. The MEM apparatus with the mirror coating also has applications for switching light beams between optical fibers for use in a local area fiber optic network, or for use in fiber optic telecommunications or data communications systems.

42 Claims, 19 Drawing Sheets

U.S. PATENT DOCUMENTS

| | | | | |
|---|---|---|---|---|
| 5,501,893 A | | 3/1996 | Laermer | 428/161 |
| 5,629,790 A | | 5/1997 | Neukermans | 359/198 |
| 5,631,514 A | | 5/1997 | Garcia | 310/309 |
| 5,654,819 A | * | 8/1997 | Goossen et al. | 359/291 |
| 5,804,084 A | | 9/1998 | Nasby | 216/2 |
| 5,862,003 A | * | 1/1999 | Saif et al. | 359/871 |
| 5,867,302 A | * | 2/1999 | Fleming | 359/291 |
| 5,959,375 A | | 9/1999 | Garcia | 310/40 MM |
| 5,999,303 A | | 12/1999 | Drake | 359/224 |
| 6,025,951 A | * | 2/2000 | Swart et al. | 359/245 |
| 6,028,208 A | | 7/2000 | Rodgers | 74/406 |
| 6,133,670 A | | 10/2000 | Rodgers | 310/309 |
| 6,175,170 B1 | | 1/2001 | Kota | 310/40 MM |
| 6,220,561 B1 | * | 4/2001 | Garcia | 248/487 |
| 6,283,601 B1 | | 7/2001 | Hagelin | 359/871 |
| 6,275,324 B1 | * | 8/2001 | Sneh | 359/291 |
| 6,300,665 B1 | * | 10/2001 | Peeters et al. | 257/415 |
| 6,309,077 B1 | * | 10/2001 | Saif et al. | 359/871 |
| 6,366,414 B1 | * | 4/2002 | Aksyuk et al. | 359/822 |

* cited by examiner

Section 1 - 1

Section 2 - 2

Section 2 - 2

Section 3 - 3

Section 4 - 4

Section 4 - 4

Section 5 - 5

Section 5 - 5

Section 6 - 6

Section 6 - 6

Section 7 - 7

Section 7 - 7

MICROELECTROMECHANICAL APPARATUS FOR ELEVATING AND TILTING A PLATFORM

CROSS REFERENCE TO RELATED INVENTIONS

This application claims the benefit of U.S. Provisional Application No. 60/196,622 filed Apr. 11, 2000.

GOVERNMENT RIGHTS

This invention was made with Government support under contract No. DE-AC04-94AL85000 awarded by the U.S. Department of Energy. The Government has certain rights in the invention.

FIELD OF THE INVENTION

The present invention generally relates to microelectromechanical devices and in particular to a microelectromechanical apparatus having a platform which can be elevated and tilted, for example, to form a micromirror for redirecting or switching an incident light beam. The present invention has applications for forming an array of tiltable micromirrors for use in switching light beams between a plurality of input optical fibers and a plurality of output optical fibers, or for forming a projected light display.

BACKGROUND OF THE INVENTION

The use of fiber optics for data communications and telecommunications is desirable to increase the bandwidth for information transmission. Lasers used for fiber optics communications produce light that can be modulated at rates up to many tens of Gigahertz (GHz). Multiple laser beams can also be wavelength division multiplexed for transmission through a single optical fiber. Presently, a limitation in information transmission with fiber optics is in routing of optical signals (i.e. modulated light) between different fibers. Thus, the need exists for optical switching technology to redirect the optical signals or portions thereof from one optical fiber to any of up to hundreds or more other optical fibers.

Surface micromachining, which can be used to build-up microelectromechanical systems (MEMS) layer by layer, is a promising technology for forming such optical signal routers (i.e. switches). The present invention is directed to a platform supported by two or three compliant elevation structures so that the platform can be tilted in an arbitrary direction to form in combination with an optical coating disposed thereon an optical switch which can be used for fiber optics signal routing, or for redirecting incident light beams for other applications such as projection displays.

An advantage of the present invention is that control of the tilt angle of the platform can be achieved by independently controlling one or more compliant elevation structures, thereby providing precise angular positioning of the platform over large tilt angles (e.g. ±20 degrees).

Another advantage of the present invention is that the use of compliant elevation structures to elevate and/or tilt the platform eliminates rubbing surfaces and thereby decreases or prevents wear-induced changes in performance over time.

A further advantage of the present invention is that the platform can be elevated or tilted with negligible stress or deformation of the platform induced by the compliant elevation structures.

Yet another advantage of the present invention is that the platform can be elevated without tilting by operating a plurality of the compliant elevation structures in unison. Such an elevatable platform can be used, for example, to control the focal plane of a focusing lens within an optical data storage device to within a fraction of a micron.

These and other advantages of the present invention will become evident to those skilled in the art.

SUMMARY OF THE INVENTION

The present invention relates to a microelectromechanical (MEM) apparatus, comprising a substrate; a platform (i.e. a stage) supported above the substrate by a trio of flexible members; and means for bending each flexible member, thereby changing the elevation or tilt of the platform. The substrate generally comprises silicon (e.g. a silicon wafer or portion thereof); and the platform generally comprises monocrystalline or polycrystalline silicon.

Each flexible member is equidistantly spaced about the platform and can be anchored to the substrate directly, or through another element to which the flexible member is connected. The other end of each flexible member can be operated independently of other flexible members supporting the platform thereby enabling the platform to be tilted. Alternately, the flexible members can be operated in unison to elevate the platform above the substrate while maintaining the platform substantially coplanar with the substrate.

The connection of each flexible member to the platform is preferably made using a compliant member. In some embodiments of the present invention, the compliant members connect a point near the midpoint of each flexible member to an outer edge (i.e. the periphery) of the platform. In other embodiments of the present invention, one end of each compliant member is connected proximate to an end of one of the flexible members; and the other end of each compliant member is connected to the platform at a point equidistant from a central axis of the platform (i.e. between the central axis and the outer edge of the platform).

The platform can have an arbitrary shape (e.g. circular or polygonal), and can further be either planar or curved (e.g. with an upper surface curved inward). The platform can also have a mirror coating on a surface thereof (e.g. the upper surface which is also termed herein as the topside) for reflecting an incident light beam. When a mirror coating is provided, the other surface of the platform can include a stress-compensation coating formed thereon, if needed, to compensate for any stress induced in the platform by the mirror coating which might otherwise distort the topography of the platform.

The means for bending each flexible member and thereby elevating or tilting the platform can comprise a microelectromechanical (MEM) actuator (e.g. an electrostatic actuator) which is operatively connected to the flexible member. In some embodiments of the present invention, each electrostatic actuator can comprise an electrostatic comb actuator which further comprises a plurality of stationary electrostatic combs attached to the substrate and a plurality of moveable electrostatic combs attached to a frame supported above the substrate, with the moveable electrostatic combs being moveable towards the stationary electrostatic combs in response to an actuation voltage (i.e. an electrical signal) provided therebetween. Each electrostatic comb further comprises a plurality of spaced fingers, with the fingers of each moveable electrostatic comb being enmeshed with the fingers of an adjacent stationary electrostatic comb.

In other embodiments of the present invention, each electrostatic actuator can comprise a vertical zip actuator which further comprises at least one first electrode supported on the substrate and a second electrode superposed above the first electrode with a spacing between the first and electrodes being variable along the length of the superposed first and second electrodes, and with the second electrode being moveable towards the first electrode in response to an actuation voltage provided therebetween. One end of the second electrode can be connected to the flexible member, and the other end of the second electrode can anchored to the substrate (e.g. through a mechanical latch). In some cases, the vertical zip actuator can be segmented to provide a plurality of separately-connected first electrodes, for example, to allow portions of the vertical zip actuator to be separately addressed for precise and repeatable control of the elevation or tilt of the platform.

In some embodiments of the present invention, each flexible member that is connected to the compliant member can be further connected to a pair of elongate elevation members juxtaposed on both sides of the flexible member, with the elevation members being anchored to the substrate (e.g. through a flexible joint).

To initially elevate the platform above the substrate after fabrication and release thereof, a plurality of pre-stressed members can be provided underneath the platform, with each pre-stressed member being anchored at one end thereof to the substrate, and with the other end of each pre-stressed member providing a force on the platform to urge the platform upward from the substrate. Each pre-stressed member can comprise an oxide material (e.g. silicon dioxide or a silicate glass) encased within a polysilicon body for producing a stress gradient in the pre-stressed member.

A plurality of restraining clips can also be optionally used for holding the platform in place during fabrication thereof, with the restraining clips being moveable away from the platform to release the platform for movement thereof. Alternately, a plurality of fuses (e.g. comprising polycrystalline silicon) can be provided to anchor the platform to the substrate during fabrication thereof, with each fuse being electrically severable to release the platform for movement.

The present invention is also related to a microelectromechanical apparatus comprising a substrate; a platform supported above the substrate by a plurality of flexible members, with each flexible member being connected to the platform at a point between a central axis of the platform and the periphery of the platform; and a plurality of electrostatic actuators providing movement in a direction substantially in the plane of the substrate, with each electrostatic actuator being operatively connected to one of the flexible members to bend the flexible member out of the plane of the substrate, thereby elevating or tilting the platform. A mirror coating can be provided on the platform for reflecting an incident light beam.

Additionally, the present invention relates to a microelectromechanical apparatus comprising a substrate (e.g. comprising silicon); a platform formed on the substrate and having a central axis oriented at an angle (e.g. 90°) to the plane of the substrate; a plurality of compliant members, each connected at a first end thereof to an underside of the platform (e.g. at a point equidistant from the central axis), with the plurality of compliant members further being arranged symmetrically about the central axis; a plurality of elongate flexible members, each connected at an inner end thereof to a second end of one of the compliant members, with an outer end of each elongate flexible member being operatively connected to an electrostatic actuator; and at least one elongate elevation member connecting each flexible member to the substrate. Each elevation member acts in combination with the flexible member to which the elevation member is connected to elevate or tilt the platform in response to a force provided on the outer end of the flexible member by the electrostatic actuator. Generally, the plurality of flexible members comprises a trio of flexible members.

The platform can be, for example, either circular or polygonal and can include a mirror coating on a topside thereof. If needed, a stress-compensation coating can be deposited on the underside of the platform to compensate for any stress induced in the platform by the mirror coating. The apparatus can further include a plurality of fuses or restraining clips for securing the platform to the substrate, with the fuses being electrically severable and the restraining clips being removable to release the platform for movement.

To aid in elevating the platform, a plurality of pre-stressed members can be located beneath the platform, with each pre-stressed member being anchored at one end thereof to the substrate, and with the other end of each pre-stressed member providing an upward force on the underside of the platform to urge the platform away from the substrate. The pre-stressed members can be elongate, and can be oriented along a line from the central axis. In such arrangement, each pre-stressed member can be anchored to the substrate at a point proximate to the central axis.

The present invention is further related to a microelectromechanical apparatus that comprises a substrate (e.g. comprising silicon); a platform supported above the substrate by a plurality (e.g. two or three) of elongate flexible members; at least one elevation member connected at one end thereof to each flexible member, with the other end of the elevation member being anchored to the substrate through a flexible joint; and an electrostatic actuator operatively connected to the other end of each flexible member to provide a force to the flexible member, thereby flexing the flexible member and elevatating or tilting the platform. The flexible members can be spaced by an angle of 120 degrees (120°) about a central axis of the platform. Each flexible member preferably supports the platform by a compliant member which connects the flexible member to the platform. For redirecting an incident light beam, the platform can include a mirror coating on a topside thereof. When two flexible members are used, the platform can be anchored on one side thereof to the substrate by a flexible hinge.

Finally, the present invention is related to an apparatus for redirecting an incident light beam that comprises a mirror supported above a substrate for reflecting the incident light; and a trio of electrostatic actuators spaced about a central axis of the mirror and operatively connected to tilt the mirror in response to an actuation voltage provided to at least one of the trio of electrostatic actuators. The substrate can comprise silicon; and the mirror can comprise polycrystalline silicon. The mirror comprises a platform with a light-reflective coating thereon, with the platform being planar to form a planar mirror (i.e. a flat mirror), or with the platform being curved to form a curved mirror (e.g. a spherical mirror).

Each electrostatic actuator can be operatively connected to the mirror through a flexible member which is bendable out of the plane of the substrate. A compliant member can also be located between each flexible member and the mirror to connect each compliant member to the mirror at a point at the periphery of the mirror or between the periphery and the central axis of the mirror. A displacement multiplier can also be located between the electrostatic actuator and the flexible member.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 12A shows an enlarged plan view of the vertical zip actuator of FIG. 11 with the mechanical latch engaged to elevate the flexible member and the elevation members for operation of the apparatus.

DETAILED DESCRIPTION OF THE INVENTION

Figure 1A:
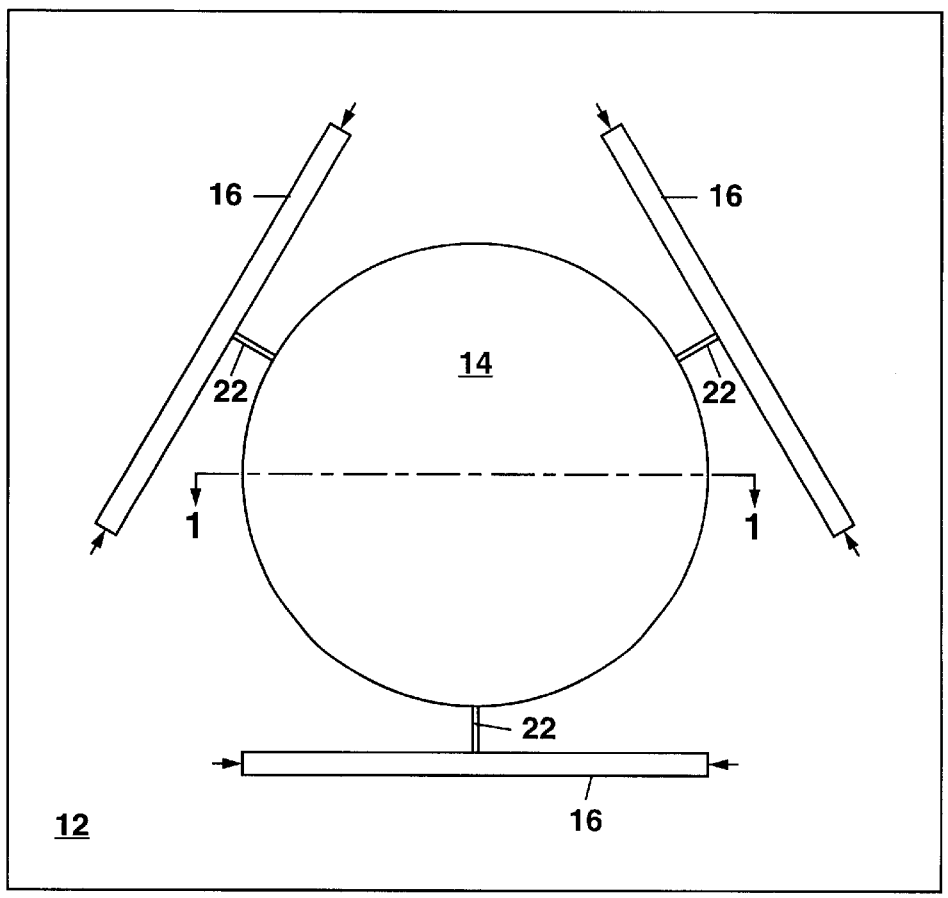
FIG. 1A shows a schematic plan view of a first embodiment of the apparatus of the present invention.

Referring to FIG. 1, there is shown a schematic plan view of a first embodiment of the microelectromechanical (MEM) apparatus 10 of the present invention. The apparatus 10 comprises a substrate 12, a platform 14 supported above the substrate by a plurality of flexible members 16, and means for bending each flexible member to elevate or tilt the platform 14. In FIG. 1, the bending means is indicated by a plurality of arrows which show the directions of applied mechanical actuation forces which can be generated by MEM actuators 18 which will be described in detail hereinafter (see FIGS. 3A and 3B, and FIGS. 15A–15C). In FIGS. 1A and 1B, the actuation forces are generally directed substantially in the plane of the substrate 12, but act to bend each flexible member 16 and displace the member 16 out of the plane of the substrate 12. In other embodiments of the present invention, the actuation forces can be directed substantially normal to the plane of the substrate 12 to bend and displace the flexible member 16 in a direction that is out of the plane of the substrate 12 (see FIGS. 15A–15C). Although, the MEM actuator 18 will be described hereinafter as an electrostatic actuator, those skilled in the art will understand that other types of surface-micromachined actuators can be substituted for the electrostatic actuator, including thermal actuators and electrostatic micromotors.

Figure 1B:
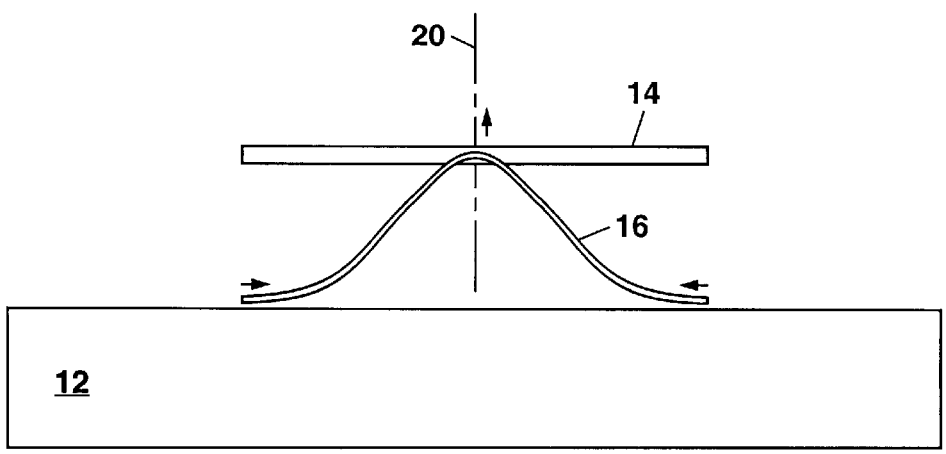
FIG. 1B shows a schematic side view of the first embodiment of the apparatus in FIG. 1A to illustrate operation of the flexible member for elevating or tilting the platform.
Figure 1C:
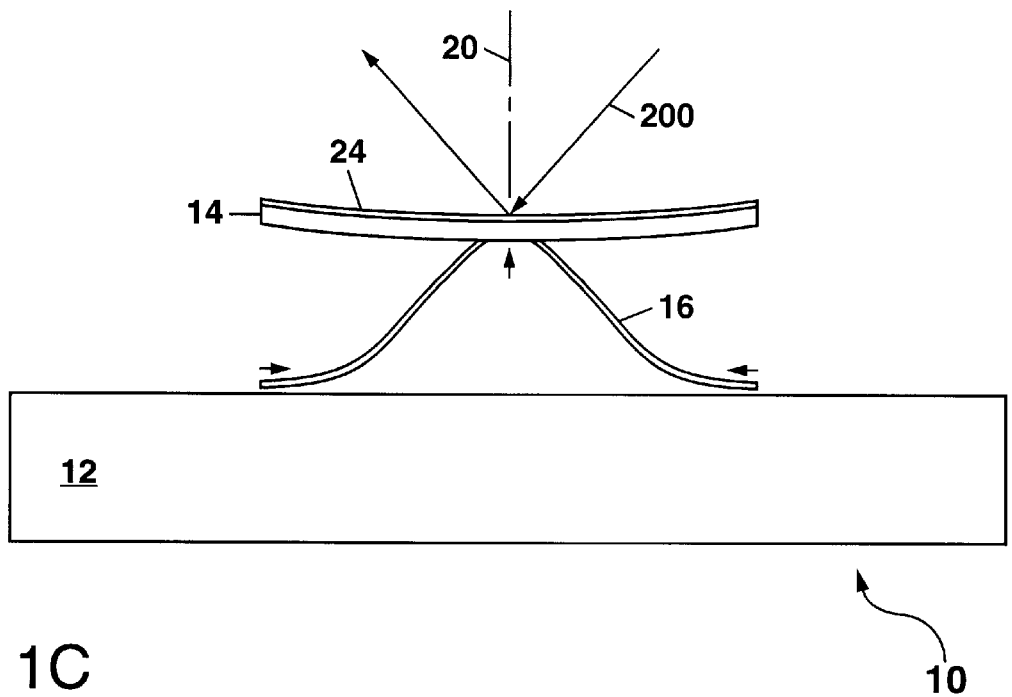
FIG. 1C shows a schematic side view of the first embodiment of the apparatus in FIG. 1A with an optional mirror coating provided on a topside of the platform.
Figure 1D:
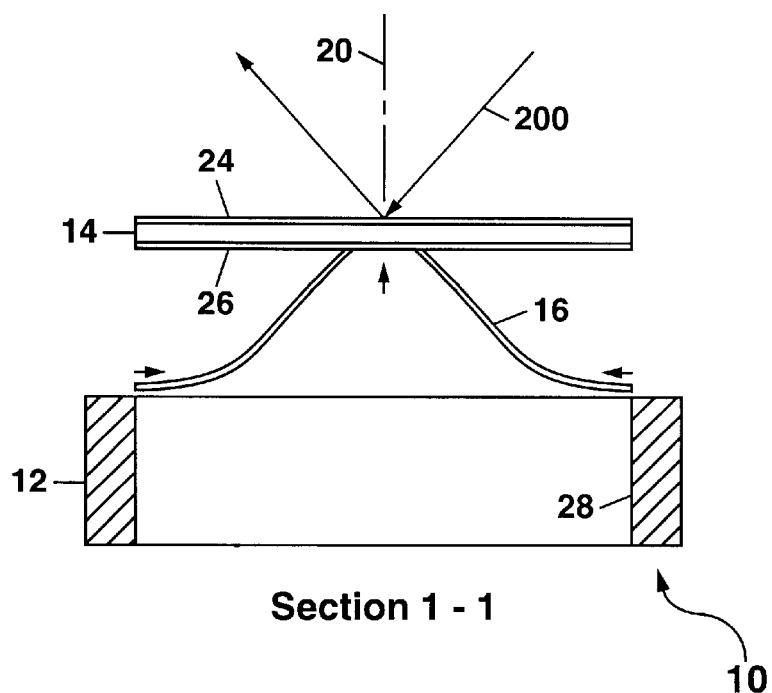
FIG. 1D shows a schematic cross-section view of the first embodiment of the apparatus in FIG. 1A along the section line 1—1 to illustrate formation of an opening through the substrate for depositing a stress-compensation coating on an underside of the platform.

In FIG. 1B, the mechanical forces provided to the flexible members 16 result in an upward displacement of the members 16 out of the plane of the substrate 12. This elevates the platform 14, which can have lateral dimensions on the order of 100 microns ($\mu$m) up to several millimeters, and can also tilt the platform 14 when the upward displacement of the individual flexible members 16 is unequal. The exact upward displacement and/or angle of tilt of the platform 14 will depend upon the mechanical forces provided to bend each flexible member 16. Furthermore, the platform 14 can be tilted in an arbitrary direction with respect to the substrate 12 (e.g. for redirecting an incident light beam 200 as shown in FIGS. 1C and 1D), or switched over time between a plurality of different directions by changing the mechanical forces provided to one or more of the flexible members 16.

The apparatus 10 of FIGS. 1A and 1B including any MEM actuators 18 can be formed using conventional surface micromachining of multiple polycrystalline silicon (also termed polysilicon) layers with intervening sacrificial oxide layers (e.g. comprising silicon dioxide or a silicate glass) on a silicon or silicon-on-insulator substrate (see e.g. U.S. Pat. Nos. 5,631,514 and 6,082,208 which are incorporated herein by reference for further details of processes for fabricating surface micromachined structures having four and five levels of polysilicon, respectively).

Those skilled in the art understand that surface micromachining involves many processing steps for building up a particular structure for a microelectromechanical device. These surface micromachining process steps are based on conventional integrated circuit (IC) processing steps, including material deposition, photolithography, masking, etching, mask stripping, and cleaning. Up to hundreds of individual process steps can be used to form the completed structure of the MEM apparatus 10 based on repeated deposition and patterning of alternating layers of polysilicon and the intervening sacrificial oxide, with the apparatus 10 being built up layer by layer. The term "patterning" as used herein refers to a sequence of well-known processing steps including applying a photoresist to the substrate 12, prebaking the photoresist, aligning the substrate 12 with a photomask, exposing the photoresist through the photomask, developing the photoresist, baking the wafer, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial oxide layer in preparation for defining features into the layer by etching.

To briefly summarize the surface micromachining fabrication process used to construct the MEM apparatus 10, a silicon or silicon-on-insulator substrate 12 can be initially coated with dielectric isolation films of low-pressure chemical vapor deposition (LPCVD) silicon nitride (about 8000 Å thick) over a thermal oxide (about 6300 Å thick). Each subsequently deposited and patterned layer of polysilicon or sacrificial oxide can be, for example, in the range of 0.3–2 $\mu$m thick, with the exact layer thickness depending upon the particular elements of the apparatus 10 to be fabricated from each layer of polysilicon or separated by each layer of the sacrificial oxide. The first patterned layer of polysilicon (termed Poly-0) is generally used to form electrical interconnections (e.g. wiring between bond pads and the MEM actuators 18 and electrically active portions of the MEM actuators 18, 44 and 90) and to form ground planes as needed (e.g. underlying the platform 14, the flexible member 16, and the elevation members 66). The Poly-0 layer is not structural and can be relatively thin (about 3000 Å) with phosphorous doping to improve electrical conductivity. Other of the polysilicon layers can be doped (e.g. by ion implantation) for electrical conductivity as needed. All mechanical polysilicon depositions are LPCVD fine-grained polysilicon deposited at 580° C.

Up to four additional polysilicon layers can be used as mechanical (i.e. structural) layers to build up the structure of the apparatus 10. A first structural polysilicon layer (termed Poly-1) can be used to form a second electrode 112 of a vertical zip actuator 90, with a superposed first electrode 110 being formed from the Poly-0 layer. Alternately, the second electrode can be formed by laminating together the Poly-1 layer and a second structural layer termed Poly-2. The Poly-1 and Poly-2 layers can also be laminated together with an intervening layer of the sacrificial oxide to form a plurality of pre-stressed members 74 as described hereinafter. The Poly-1 layer can be 1.0 $\mu$m thick; and the Poly-2 layer can be 1.5 $\mu$m thick. The Poly-2 layer can also be used to form each elevation member 66 which can be, for example, 1.5 $\mu$m thick×5–10 $\mu$m wide×100–500 $\mu$m long. The elevation members 66 can be anchored to the substrate 12 using an anchor point 70 and a flexible joint 72 (i.e. a flexure) which can be fabricated, for example, from the Poly-1 layer.

Each flexible member 16 can be formed from a third structural layer of polysilicon (termed Poly-3) which can be 2.25 $\mu$m thick. The width and length of each flexible member 16 will depend upon the size of the platform 14 and the particular embodiment of the present invention in which the flexible member 16 is used. Generally, the flexible member 16 can have a width in the range of 5–50 $\mu$m and a length in the range of 100–2000 $\mu$m or more depending upon the size of the platform 14 and the amount of elevation or tilt to be provided thereto. The platform 14 can be formed from either a fourth polysilicon layer (termed Poly-4) which can be 2.25 $\mu$m thick, or alternately from a combination of the Poly-3 and Poly-4 layers laminated together (see e.g. FIG. 4 where arcuate polysilicon portions 42 and a lower portion 14' are formed from the Poly-3 layer with the remainder of the platform 14 being formed from the Poly-4 layer). Each compliant member 22 can be formed from the Poly-3 or Poly-4 layers, or from both.

The Poly-0 through Poly-4 layers can be used to build up the structure of the electrostatic comb actuators 44, while the Poly-1 through Poly-4 layers can be used to form a yoke 48 and a displacement multiplier 46 which can be used together with the actuators 44 to provide the force required to operate the apparatus 10. A plurality of fuses 82 can be formed from the Poly-1 through Poly-3 layers for attaching the platform 14 to the substrate 12 during fabrication. Alternately, a plurality of restraining clips 88 can be used to secure the platform 14, with the restraining clips 88 being formed, for example, from the Poly-2 through Poly-4 layers.

The planarity of each layer of polysilicon or sacrificial oxide can be maintained during build-up of the apparatus 10 by using chemical mechanical polishing (CMP) as known to the art (see e.g. U.S. Pat. No. 5,804,084 which is incorporated herein by reference). Planarization of the polysilicon and sacrificial layers used to build up the platform 14 using CMP can be advantageous to present a smooth surface topography especially when the platform 14 is used to form a mirror for reflecting an incident light beam. Post-deposition annealing of the polysilicon layers can also be used to minimize internal stress which could otherwise distort the platform 14 upon a final etch-release step in which a solution or vapor comprising hydrofluoric acid (HF) is used to etch away the various sacrificial oxide layers separating and encapsulating the polysilicon layers during build-up of the structure of the MEM apparatus 10. Such annealing does not, however, affect elements of the apparatus 10 which are specially designed to have a built-in stress gradient (e.g. pre-stressed members 74).

In the above etch-release step, which can require several hours or overnight, a plurality of micron-sized openings (not shown) can be formed through the various polysilicon layers to permit the HF to reach the underlying sacrificial oxide. This is especially important for removal of the sacrificial oxide underneath large-area elements of the apparatus 10 such as the platform 14. After removal of the sacrificial oxide, the micron-sized openings can be optionally plugged by deposition of a layer of silicon nitride using LPCVD.

In the apparatus 10 of the present invention as shown in FIGS. 1A and 1B, preferably a trio of flexible members 16 are used since three members 16 are adequate to control the elevation and tilt of the platform 14. These three flexible members 16 can be equidistantly spaced about the platform 14 (i.e. with a 120° angular separation between connection points to the platform 14) as shown in FIG. 1A. Once the elevation of the platform 14 is established by an appropriate selection of the forces on the various flexible members 16, the use of a trio of flexible members 16 requires only two electrical signals (i.e. activation voltages) to the MEM actuators 18 providing forces to two of the three flexible members 16 in order to tilt the platform 14 to an arbitrary angle with respect to the substrate 12. Tilting of the platform 14 results from a difference in elevation of the flexible members 16. In some embodiments of the present invention, only a pair of flexible members 16 are required when the platform 14 is anchored to the substrate 12 on one side thereof with a flexible hinge 126 (see FIGS. 16A and 16B).

To minimize stress on the platform which could otherwise possibly distort the platform due to bending of the flexible members 16 in the embodiment of the present invention shown in FIGS. 1A and 1B, a resultant vertical force (indicated by the vertical arrow in FIG. 1B) provided from the flexible member 16 is coupled to the platform 14 at its periphery using a compliant member 22. The compliant member 22 can be, for example, about 1 μm wide×2–6 μm high to provide a stiffness in the vertical direction that is greater than the stiffness in lateral directions substantially parallel to the plane of the platform 14. This results in the vertical force being applied in a direction normal to the plane of the platform 14 to lift the platform 14 without any sideways stress that could possibly distort or deform the platform 14. Additionally, the compliant member 22 allows for some lateral movement of each flexible member 16 with respect to the platform 14 as the forces applied to each member 16 are varied to to elevate or tilt the platform 14. Although some rotation of the platform 14 is possible during elevation or tilting thereof, the three compliant members 22 in FIG. 1A cooperate to minimize any lateral forces applied to the platform 14.

Although the platform 14 is generally fabricated to be planar, the platform 14 can, under certain circumstances, assume a curved shape (i.e. with a concave or convex upper surface). A concave platform 14 is schematically illustrated in FIG. 1C. The curved shape can result from stress induced in the platform 14 by deposition of a light-reflective mirror coating 24 thereon for use in redirecting (i.e. reflecting) an incident light beam 200. The mirror coating 24, which can be applied to any of the embodiments of the apparatus 10 described herein, can comprise any type of reflective metal coating or dielectric mirror coating as known to the art, with the selection of a particular mirror coating generally being determined by a particular application of the apparatus 10 which will define the desired reflectivity and the wavelength of the light to be reflected by the mirror coating 24. Those skilled in the art will understand that metals such as gold, silver and aluminum can be used to form a reflective metal coating, and that a dielectric mirror coating can be formed by alternately depositing layers of a relatively high index of refraction dielectric material (e.g. $TiO_2$) and a relatively low index of refraction dielectric material (e.g. $SiO_2$), with each layer having an effective optical thickness of one-quarter-wavelength ($\lambda/4n$ where n is the refractive index of the dielectric material forming each layer). Bowing of the platform 14 can arise, for example, from differences in thermal expansion of the platform 14 and the coating material since the mirror coating is generally applied to the platform at an elevated temperature. In some cases, bowing (i.e. curvature) of the platform 14 due to the deposited mirror coating 24 can be used to advantage (e.g. for focusing or diverging the incident light beam 200); whereas in other cases a planar mirror is required (e.g. for redirecting the incident light beam 200 without altering the shape of the beam).

To restore the planarity of the mirror formed by the platform 14 with the mirror coating 24 thereon, a stress-compensation coating 26 can be deposited on the opposite side of the platform 14. When the mirror coating 24 is applied on a topside of the platform 14, an access opening 28 can be formed completely through the substrate 12. This can be done, for example, prior to the etch-release step. The access opening 28 as shown in the schematic cross-section view of FIG. 1D can be formed, for example, by wet etching inward through the substrate 12 from the bottom thereof using a patterned etch mask (e.g. using an anisotropic wet etchant such as potassium hydroxide, tetramethyl ammonium hydroxide or ethylenediamine pyrocatechol which generally produces sloped sidewalls), or alternately by using a deep reactive ion etching process which combines multiple anisotropic etching steps with steps for simultaneously depositing an isotropic polymer/inhibitor to minimize lateral etching and sloping sidewalls. Such a deep etching process is disclosed in U.S. Pat. No. 5,501,893 to Laermer et al, which is incorporated herein by reference. The stress-compensation coating 26 can comprise the same material as the mirror coating 24 with generally the same layer thickness.

The first embodiment of the present invention in FIGS. 1A and 1B is initially fabricated with the flexible members 16 being flat (i.e. coplanar with the substrate). Forces can then be applied to each flexible member 16 for buckling thereof upward to elevate the platform 14 to a predetermined height. This can be done using the MEM actuators 18.

Figure 2A:
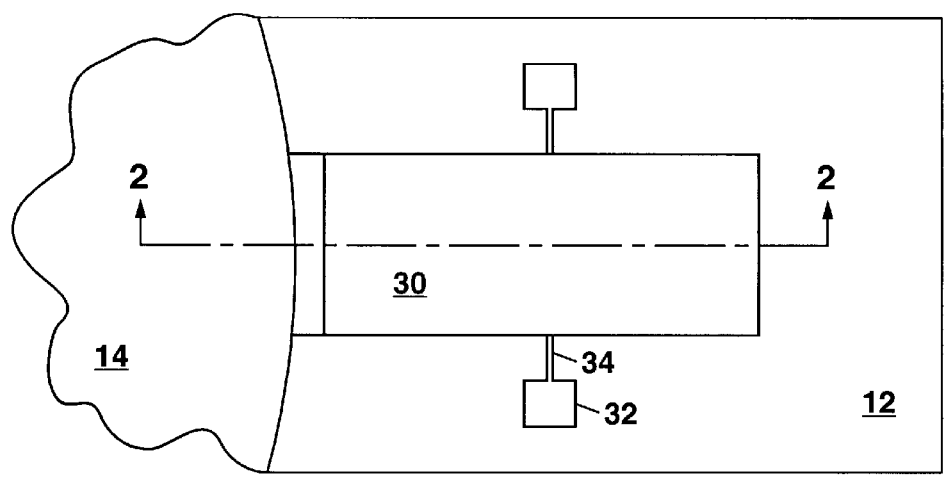
FIG. 2A shows a schematic plan view of an optional pry bar that can be used to initially elevate the platform in FIG. 1.
Figure 2B:
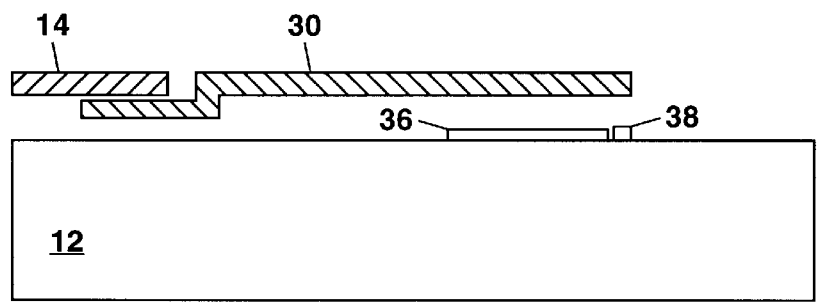
FIGS. 2B and 2C show schematic cross-section views along the section line 2—2 in FIG. 2A to illustrate operation of the pry bar for initially elevating the platform.
Figure 2C:
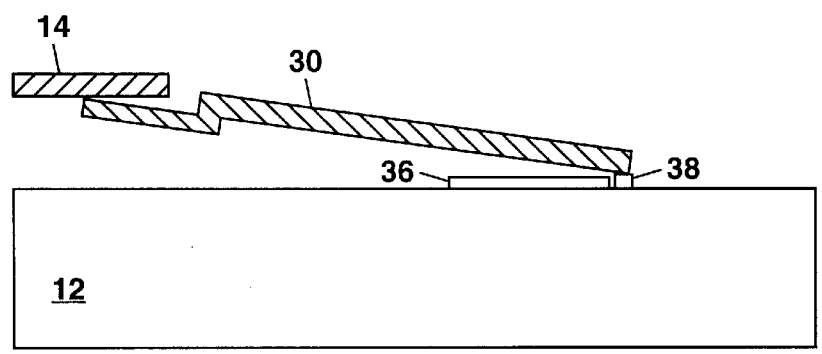

To aid in uplifting the platform 14 and the flexible members 16, one or more electrostatically activated pry bars 30 can be formed on the substrate 12 and partially underlying the platform 14 as shown in FIGS. 2A–2C. These pry bars 30 can be formed, for example, from the Poly-3 and Poly-4 layers and can be suspended above the substrate 12 and electrically grounded to the substrate 12 by support posts 32 and torsional joints 34. The support posts 32 can be formed from multiple stacked polysilicon layers (e.g. Poly-0 through Poly-4) and the torsional joints 34 can be formed from a single polysilicon layer (e.g. Poly-3 or Poly-4). The torsional joints 34 can be, for example, 1 μm wide×2 μm high×5 μm long.

A lift electrode 36, which can be formed in the Poly-0 layer, is located underneath the end of each pry bar 30 distal to the platform 14 as shown in FIG. 2B which represents a schematic cross-section view along the section line 2—2. When an activation voltage (e.g. up to about 300 volts) from a source or power supply (not shown) is provided between the electrically-grounded pry bar 30 and the lift electrode 36, an electrostatic force of attraction is generated which pulls the distal end of the pry bar 30 downward until it rests on the substrate 12 or on an optional stop 38, thereby displacing the other end of the pry bar 30 upward to elevate the platform 14 and the flexible members 16. This is shown schematically in FIG. 2C. The vertical lift provided by the pry bars 30 can be, for example, in the range of 5–20 μm with the exact vertical lift depending upon several factors including the applied actuation voltage, the mechanical advantage (determined by the location of the torsional joints 34) and the spacing between the pry bar 30 and the lift electrode 36 or stop 38. A plurality of pry bars 30 uniformly spaced about the periphery of the platform 14 can be simultaneously operated using a common actuation voltage.

In other embodiments of the present invention, alternate ways of initially elevating the platform 14 and flexible members 16 can be provided. For example, certain embodiments of the present invention as described hereinafter utilize a micromanipulator probe tip to slide a mechanical latch 96 forward or backward as needed to initially elevate the flexible members 16 and platform 14 (see FIGS. 15A and 15B). Alternately, a plurality of pre-stressed members 74 can be provided on the substrate 12 underneath the platform 14 to initially elevate the platform 14 and bend the flexible members 16 upwards after the etch-release step (see FIGS. 8A–8C).

Figure 3A:
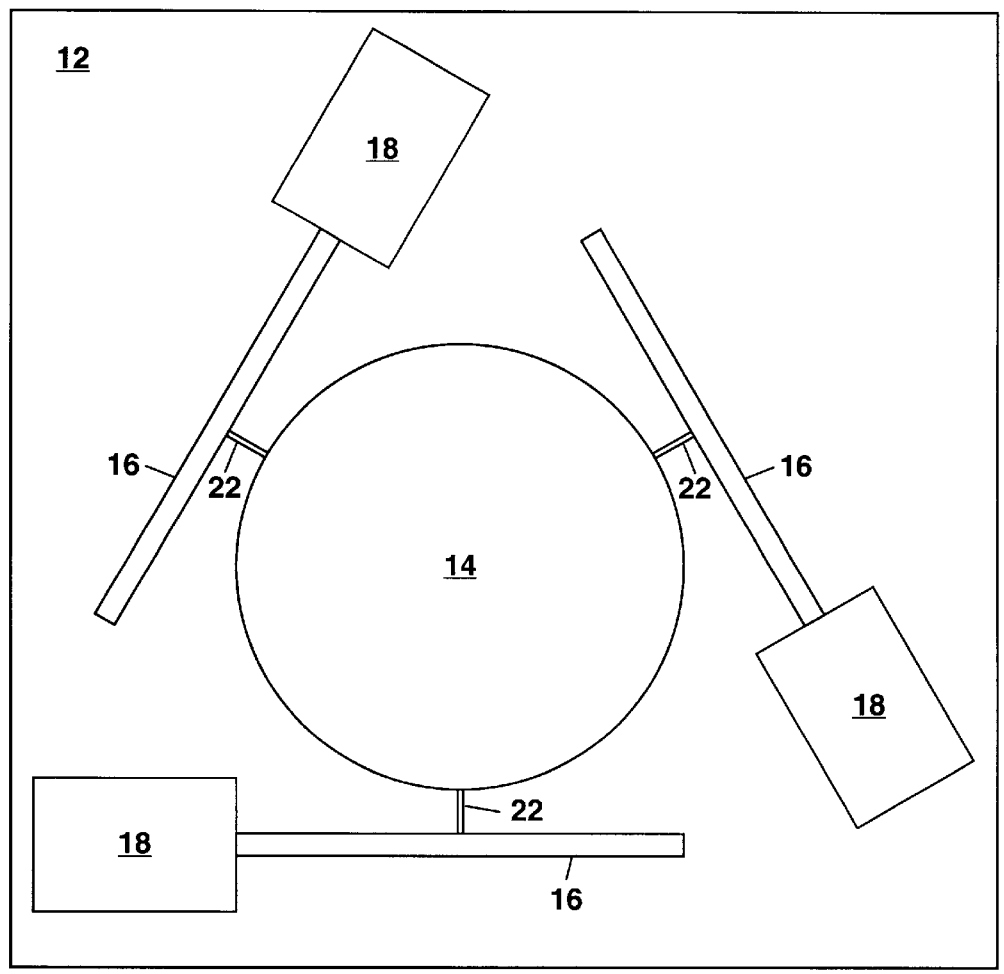
FIGS. 3A and 3B schematically illustrate a second embodiment of the present invention in plan view and in side view, respectively.
Figure 3B:
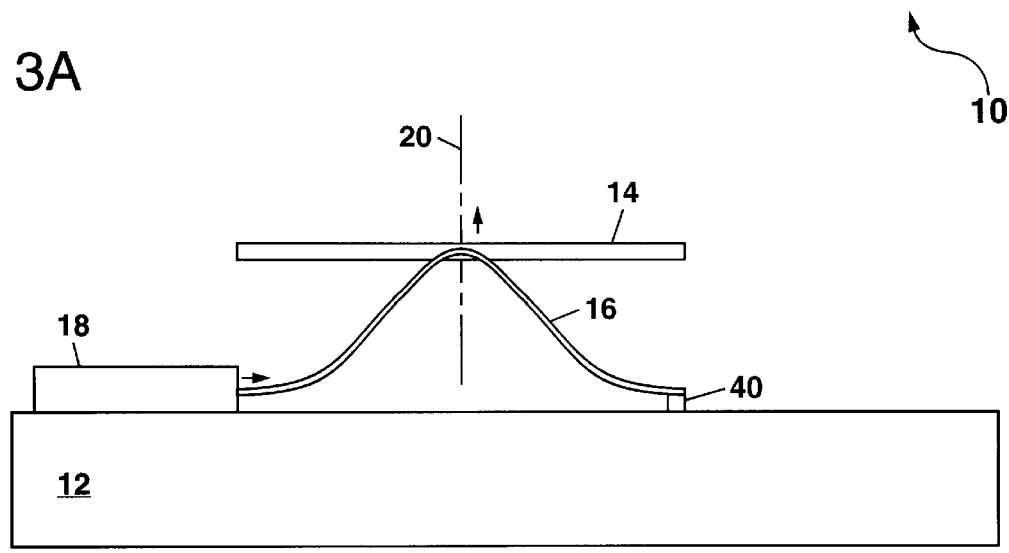

FIGS. 3A and 3B schematically illustrate a second embodiment of the present invention. This second embodiment of the present invention is similar to the first embodiment of FIGS. 1A and 1B except that one end of each flexible member 16 is attached to the substrate 12 by an anchor 40. The anchor 40 can be formed from the same layer of polysilicon used to form the flexible member 16 (e.g. by forming a via in an underlying layer of the sacrificial oxide prior to depositing the Poly-3 layer for forming the flexible member 16 so that the Poly-3 layer is attached to the substrate 12 through the underlying polysilicon layers), or can be formed from an additional layer of polysilicon (Poly-0 through Poly-2 or a combination thereof laminated together). The provision of anchor 40 on one end of each flexible member 16 simplifies operation of the apparatus 10 since only a single MEM actuator 18 need be used to provide an actuation force to the other end of each flexible member 16. Although the flexible members 16 in the plan views of FIGS. 1A and 3A are shown as being linear (i.e. straight), they can alternately be curved around the periphery of the platform 14 to save space.

Figure 6:
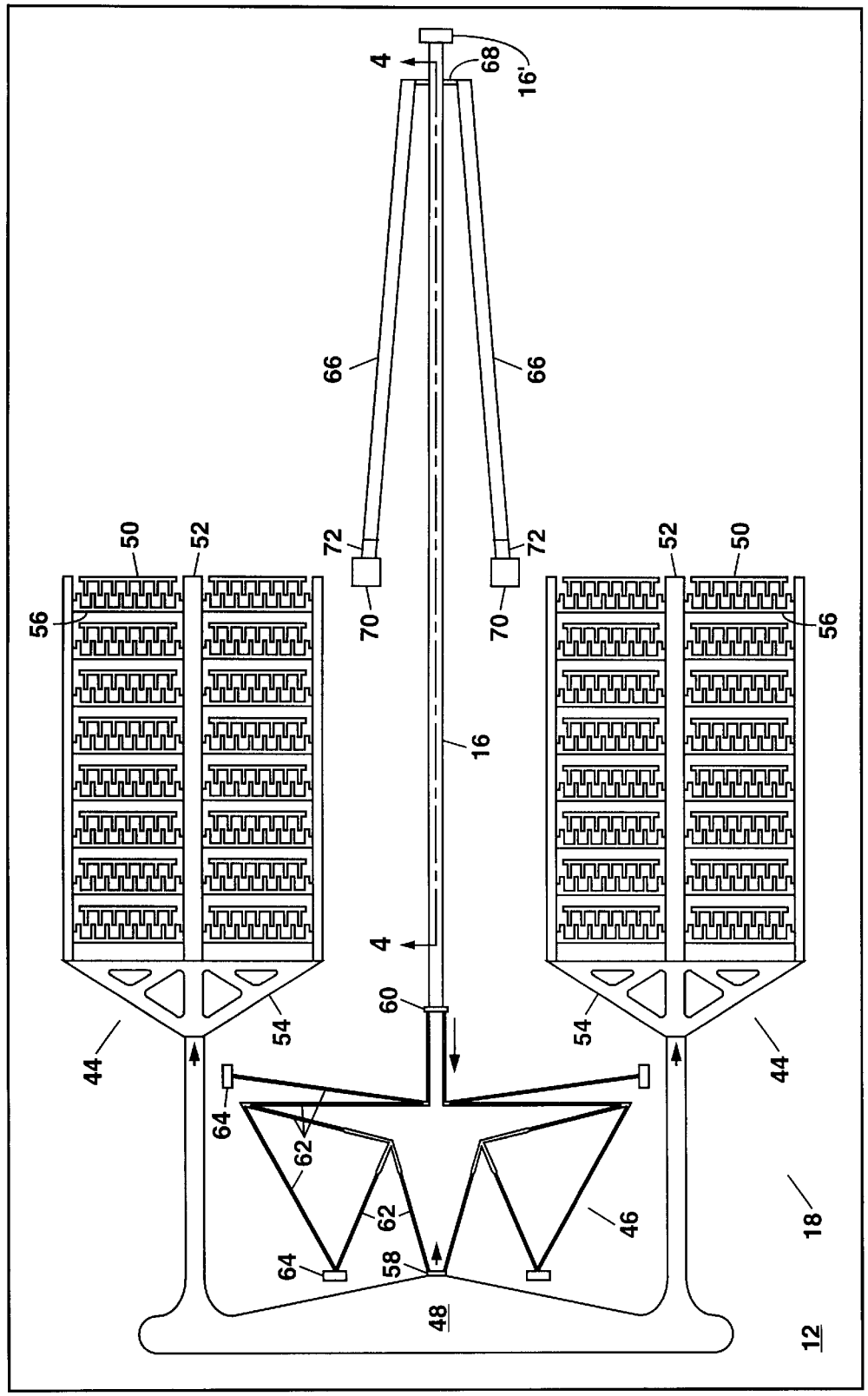
FIG. 6 shows an enlarged schematic plan view of the MEM actuator in FIG. 4.

The MEM actuator 18 in FIGS. 3A and 3B can be an electrostatic actuator such as a electrostatic comb actuator (see FIG. 6 and U.S. Pat. No. 6,133,670 which is incorporated herein by reference) or an electrostatic capacitive plate actuator (see U.S. Pat. No. 6,211,599 which is incorporated herein by reference), or any other type of electrostatic actuator as known to the art. Those skilled in the art will understand that the MEM actuator 18 in FIGS. 3A and 3B can also be a thermal actuator.

In the event that a displacement provided by the MEM actuator 18 is smaller than a desired range of lateral motion of the actuated end of the flexible member 16, a displacement multiplier 46 can be located between the MEM actuator 18 and the flexible member 16 (see FIG. 6). A compliant displacement multiplier 46 operates by lever action to increase the displacement with a corresponding reduction the actuation force provided to the flexible member 16. Further details of a displacement mulitplier 46 suitable for practice of the present invention is disclosed in U.S. Pat. No. 6,175,170 to Kota et al, which is incorporated herein by reference. Alternately, one or more lever arms supported on pin joints or flexible joints can be used as a substitute for the displacement multiplier 46 to increase the displacement provided by the MEM actuator 18.

Those skilled in the art will also understand that the end of each flexible member 16 to which the actuation force is applied can be operatively connected to a MEM actuator 18 that comprises a rack which is driven to move in the plane of the substrate 12 by an electrostatic micromotor or an electrostatic rotary actuator. An electrostatic micromotor-driven rack is disclosed in U.S. Pat. No. 6,082,208 to Rodgers et al which is incorporated herein by reference. An electrostatic rotary actuator is disclosed in U.S. Pat. No. 6,211,599 which is incorporated herein by reference.

In the apparatus 10 of FIGS. 3A and 3B, the exact displacement of the flexible member 16 used to elevate or tilt the platform 14 will depend on the size of the platform 14 and the extent to which the platform 14 is to be elevated or tilted. As an example, for a circular platform 14 having a radius of 500 μm and a trio of flexible members 16 each about 2.1 mm long, a displacement of one of the flexible members 16 by about 30 μm can be used to tilt the platform 14 over an angle θ=10° as measured between a central axis 20 of the platform 14 and a direction normal to the substrate 12. Thus, any angle within a cone of 20° angular width can be accessed by tilting the platform 14 using one or more of the flexible members 16 that are displaced by no more than about 30 μm in one direction or the other. Larger tilt angles, θ, can be achieved with larger displacements.

Figure 4:
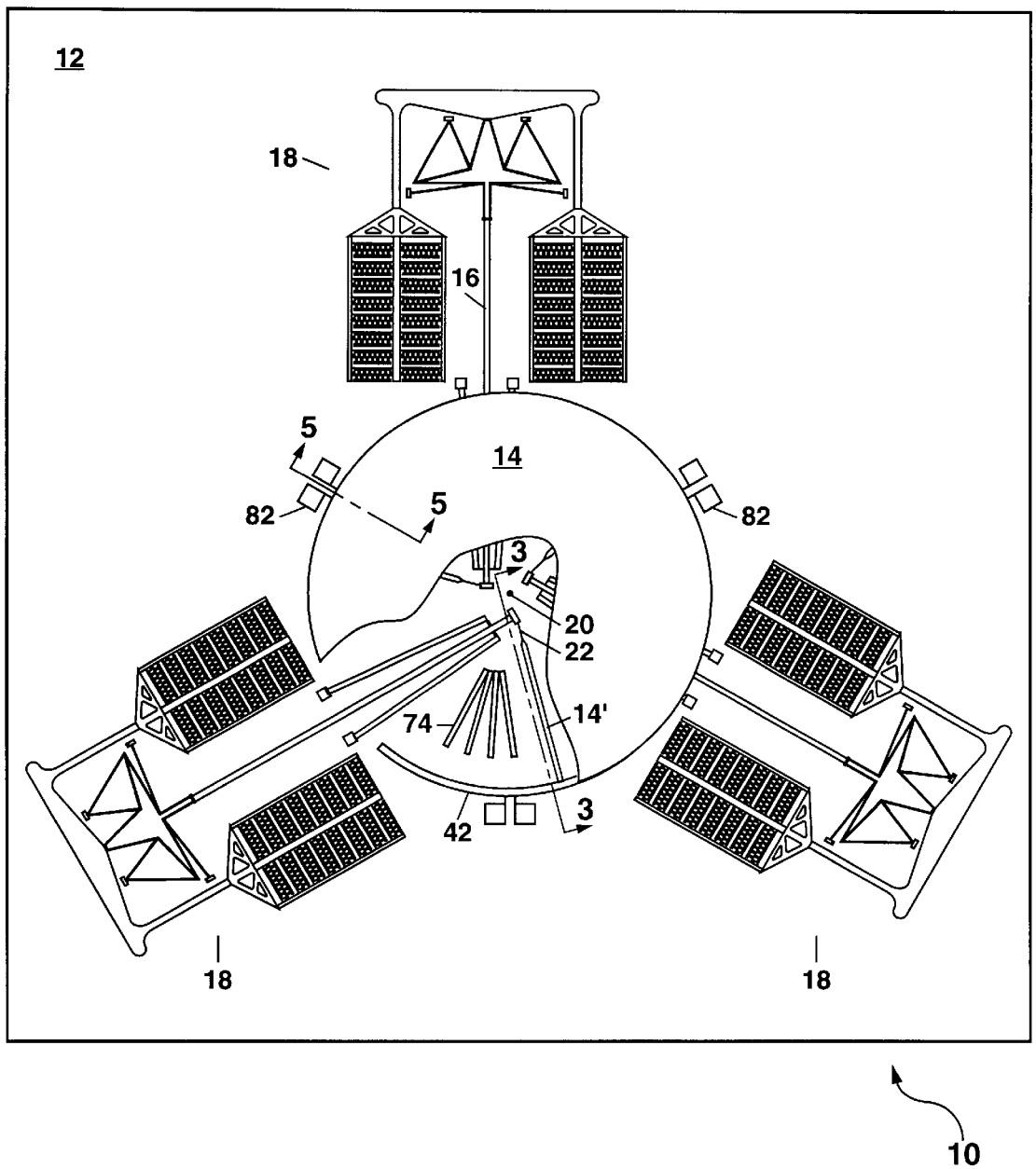
FIG. 4 schematically illustrates in plan view a third embodiment of the present invention.

FIG. 4 schematically illustrates in plan view a third embodiment of the MEM apparatus 10 of the present invention, with a part of the platform 14 being shown cut away to reveal the structure of a lower portion 14' of the platform 14 and the connection of the flexible member 16 to the lower portion 14' using a compliant member 22. In FIG. 4, the trio of flexible members 16 are arranged symmetrically about a central axis 20 of the platform, with each compliant member 16 being connected to the lower portion 14' of the platform 14 at a point equidistant from the central axis 20. A connection point that is located between the central axis 20 and the periphery of the platform 14 as shown in FIG. 3 is advantageous since it increases the elevation or tilt for a given displacement of the flexible member 16 as compared to a connection to the periphery of the platform 14 as shown in the devices 10 of FIGS. 1A and 1B and FIGS. 2A and 2B.

Figure 5A:
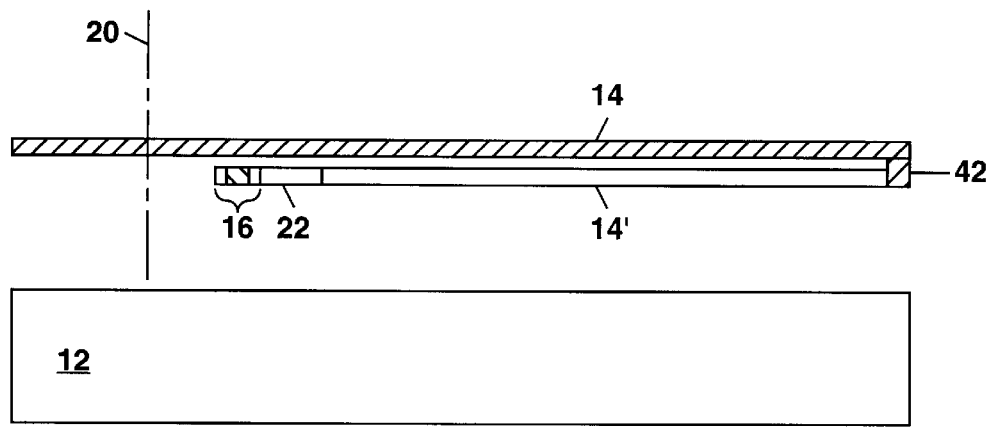
FIG. 5A shows a schematic cross-section view along the section line 3—3 in FIG. 4 to illustrate details of the platform and the attachment of the flexible member to the platform using a compliant member.

FIG. 5A schematically illustrates the connection of the flexible member 16 to the platform 14 through the lower portion 14' thereof along the section line 3—3 in FIG. 4. An upward-directed force provided by flexible member 16 is conveyed through the compliant member 22 and the lower portion 14' to the platform 14 at its periphery. This minimizes any distortion of the platform 14 that could otherwise possibly occur if the flexible member 16 were connected directly to the platform 14 near the central axis 20. The lower portion 14' can be formed from a different polysilicon layer (e.g. Poly-3) from the remainder of the platform 14 which can be formed from the Poly-4 layer. An intervening sacrificial oxide layer (not shown in FIG. 5A) can be used to provide a spacing of, for example, 2 μm between the lower portion 14' and the remainder of the platform 14.

In FIG. 5A, the compliant member 22 can be formed as a vertically-oriented ribbon (e.g. with a width of 1 μm and a height of 2.25 μm) to provide a stiffness in the vertical direction that is larger than the stiffness in the horizontal direction (i.e. the lateral direction). Although the compliant member 22 is shown herein as being linear (i.e. straight), those skilled in the art will understand that the compliant member 22 can also be formed with other shapes. For example, a serpentine shape (i.e. with a plurality of folds) for the compliant member 22 can be used to save space while increasing the compliance in the lateral direction compared to the compliance in the vertical direction. As another example, a pair of compliant members 22 can be used to attach opposites sides of a head 16' of the flexible member 16 to the platform 14 (see FIG. 6).

The compliant member 22 is used to convey any vertical displacement of the flexible member 16 to the lower portion 14' and therefrom to the periphery of the platform 14 which can be stiffened by a plurality of arcuate polysilicon portions 42 arranged about the central axis 20. The arcuate polysilicon portions 42 can be formed by depositing the Poly-4 layer into arcuate trenches formed in the intervening sacrificial oxide layer (not shown) so that the Poly-4 layer is laminated with an arcuate portion of the underlying Poly-3 layer.

Figure 7A:
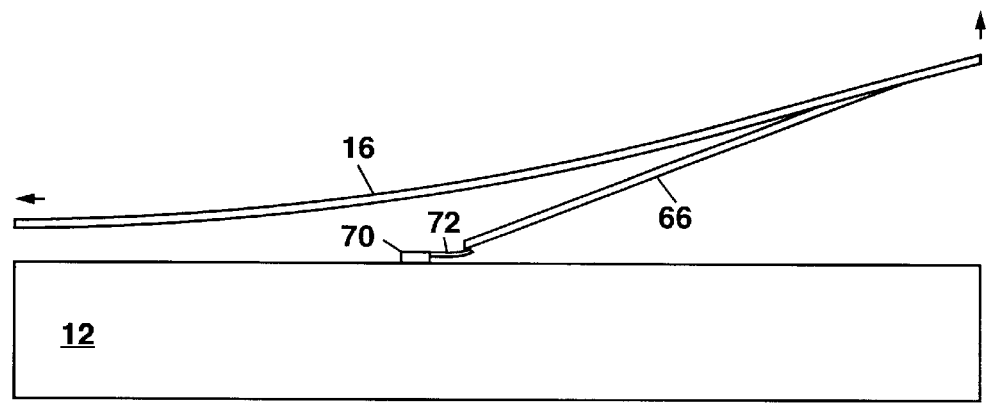
FIGS. 7A and 7B show schematic cross-section views along the section line 4—4 in FIG. 6 to illustrate use of the MEM actuator to change the elevation of flexible member and elevation members, thereby elevating or tilting the platform.
Figure 7B:
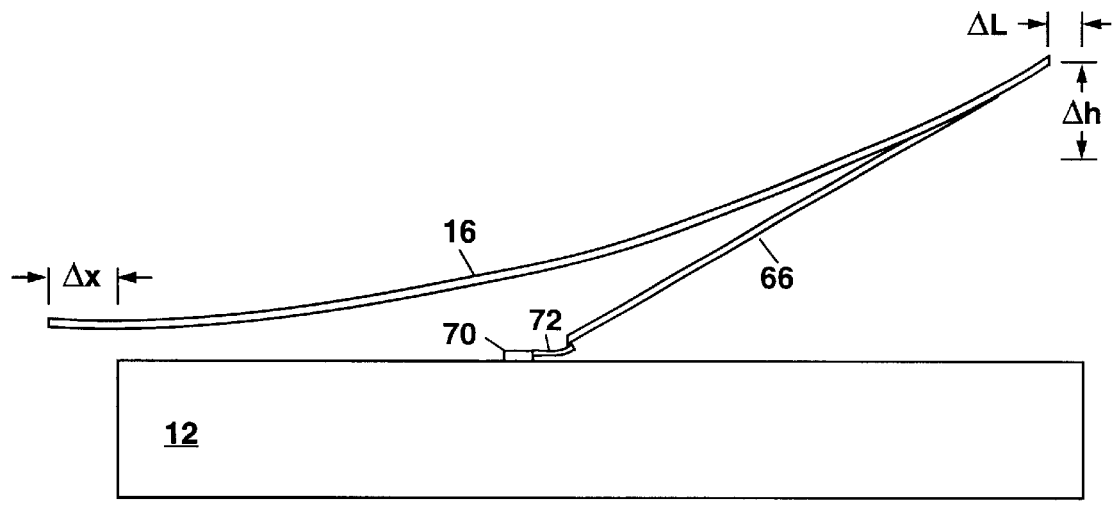

The structure of the apparatus 10 shown in FIG. 5A allows each MEM actuator 18 to move the platform 14 upward or downward or to tilt the platform 14 about a predetermined angle without distorting the surface of the platform 14. Furthermore, the use of the compliant members 22 for connecting the flexible members 16 to the platform 14 allows a limited range of movement of the flexible members 16 in the lateral direction as the height of the flexible member 16 is changed. FIGS. 7A and 7B show a small lateral displacement, ΔL, of the elevated end of the flexible member 16 with a change in elevation, Δh, which is due to the other end of the flexible member 16 being displaced in the plane of the substrate 12 by an amount Δx. The lateral displacement, ΔL, results in a slight rotation of the platform 14 with a change in elevation or tilt thereof.

Figure 16A:
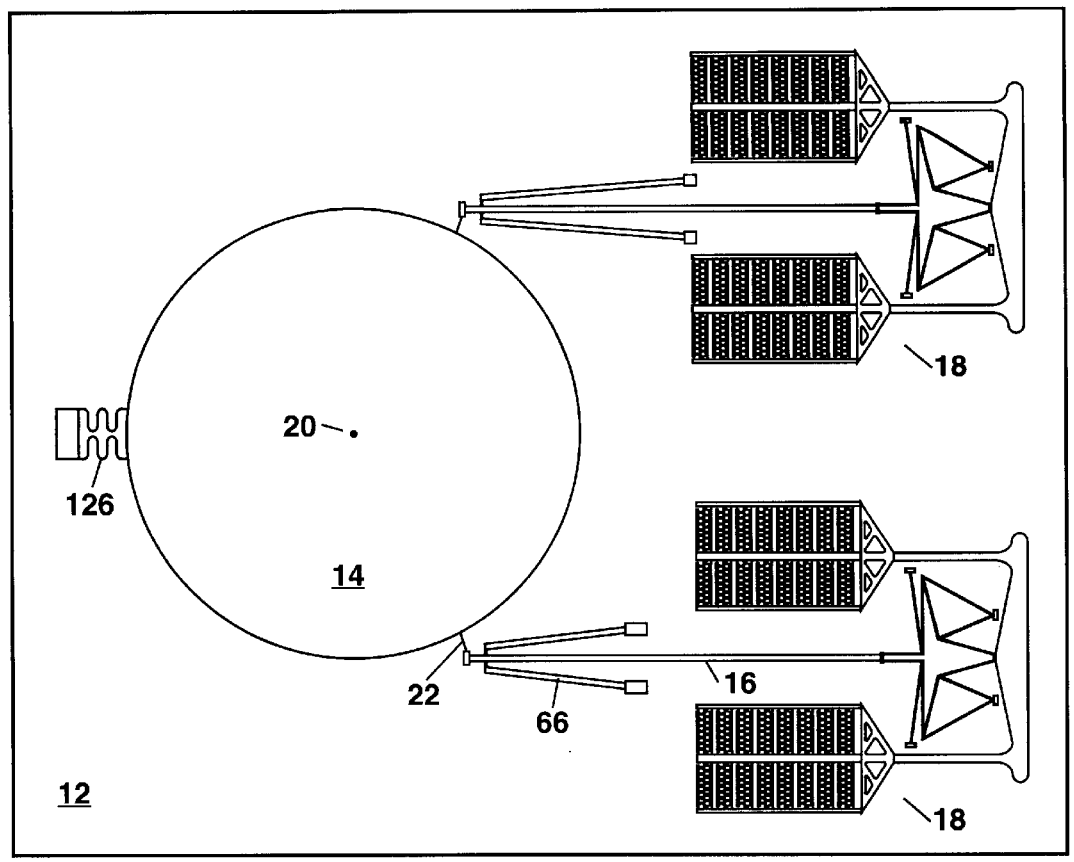
FIGS. 16A and 16B show a schematic plan view and a side view, respectively, for a sixth embodiment of the present invention.

In other embodiments of the present invention, the lower portion 14' can be omitted and the connection of the MEM actuator 18 and flexible members 16 shown in FIG. 6 can be made to platform 14 or to the arcuate polysilicon portions 42 by locating the compliant members 22 about the periphery of the platform 14 as shown in FIGS. 1A, 3A and 16A (e.g. when a stress-compensation coating 26 is to be formed on the underside of the platform 14 as described previously with reference to FIG. 1D).

Figure 5B:
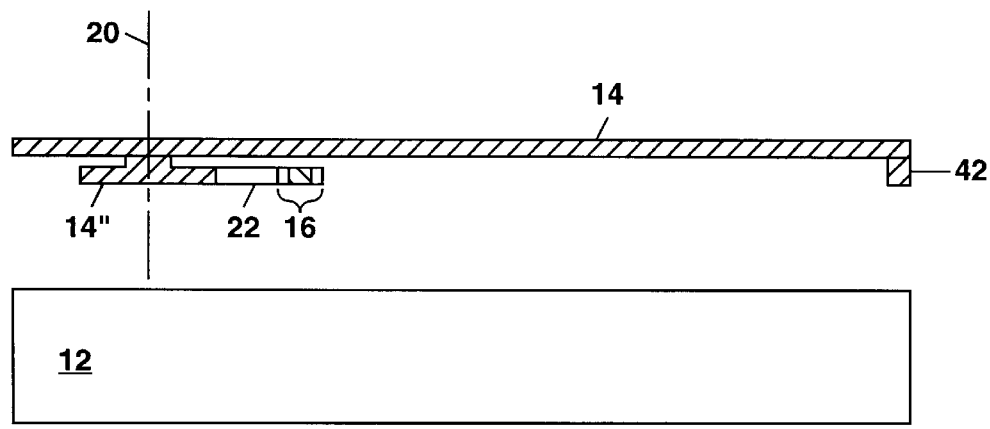
FIG. 5B schematically illustrates an alternate connection of the flexible members to the platform using a sub-platform.

In yet other embodiments of the present invention, the platform 14 can include a sub-platform 14" having smaller lateral dimensions than the platform 14 and centered about the central axis 20 underneath the platform 14 as schematically illustrated in FIG. 5B. The flexible members 16 can then be connected to the sub-platform 14" rather than directly to the platform 14 or to the lower portion 14'. If the sub-platform 14" is used, the arcuate polysilicon portions 42 can be optionally used to stiffen the platform 14.

FIG. 6 shows an enlarged plan view of the MEM actuator 18 in FIG. 4. The MEM actuator 18 comprises a pair of electrostatic comb actuators 44 coupled to drive a compliant displacement multiplier 46 through a yoke 48. Each electrostatic comb actuator 44 further comprises a plurality of moveable electrostatic combs 50 attached to a rigid framework 52 (i.e. a frame) which can include a truss 54 to concentrate the force produced by the actuator 44, and a plurality of stationary electrostatic combs 56 attached to the substrate 12. Each electrostatic comb 50 and 56 can be built up by conventional surface micromachining from one or more layers of deposited and patterned polysilicon (e.g. 3–4 structural polysilicon layers with an overall thickness of 4–7 μm). The rigid framework 52 is supported above the substrate 12 by a plurality of springs (not shown) which can be folded underneath the framework 52 to save space. The rigid framework 52 allows the moveable and stationary electrostatic combs, 50 and 56, to have interdigitated fingers about 1–2 μm wide and 3–10 μm long and to be closely spaced (e.g. ≦1 μm between the fingers of the two combs 50 and 56) so that a relatively large force can be produced by each electrostatic comb actuator 44 when an actuation voltage (e.g. 15–90 V) is provided between the moveable and stationary electrostatic combs, 50 and 56. The moveable electrostatic combs 50 and the supporting frame 52 are preferably maintained at ground electrical potential by an electrical connection that can be made through the springs underlying the frame 52 to the substrate 12, or to electrical wiring 94 formed by patterning the Poly-0 layer. Further details of the electrostatic comb actuators 44 can be found in U.S. Pat. No. 6,133,670 which is incorporated herein by reference.

Those skilled in the art will understand that other types of electrostatic actuators can be used for practice of the present invention. For example, capacitive plate electrostatic actuators as disclosed in U.S. Pat. No. 6,211,599 can be substituted for the electrostatic comb actuators 44 in the device 10 of FIG. 4.

The rigid structure of the electrostatic comb actuators 44 in FIG. 6 generally limits an available output displacement to a few μm (e.g. 2–3 μm). Therefore, a compliant displacement multiplier 46 is provided to multiply the displacement provided by the actuators 44 by a predetermined factor of (e.g. 10–20) that is sufficient to provide a predetermined range of displacement of the flexible member 16 as needed to elevate the platform 14 or to tilt the platform 14 over a predetermined angle. The displacement multiplier 46 comprises an input end 58 and an output end 60, with a plurality of beams 62 formed from multiple stacked and interconnected layers of polysilicon (e.g. Poly-1 through Poly-4) being connected between the input end 58 and the output end 60 as shown in FIG. 6, and with some of the beams 62 being anchored to the substrate 12 by supports 64 and with the remainder of the beams 62 being suspended above the substrate 12. Each beam 62 in the displacement multiplier 46 can be, for example, about 1–3 μm wide×5–7 μm high× 50–200 μm long.

The displacement multiplier 46 receives an input displacement (indicated by the small arrows in FIG. 6) and an input force from the electrostatic comb actuators 44 through the yoke 48 at the input end 58 and generates a multiplied output displacement (indicated by the large arrow in FIG. 6) and a correspondingly reduced output force at the output end 60 of the displacement multiplier 46. The displacement multiplier 46 operates by directing the input force along certain of the beams 62 and by flexing other of the beams 62 so that a lever action is produced to multiply the input displacement without the need for any rotating joints (i.e. pin joints). Depending upon the design of the displacement multipler 46 and the arrangement of the various beams 62, the output displacement can be either 180° out-of-phase with the input displacement as shown in FIG. 6, or in-phase with the input displacement. Further details of the fabrication and operation of this type of surface micromachined displacement multiplier 46 can be found in U.S. Pat. No. 6,175,170 which is incorporated herein by reference.

In FIG. 6, movement of the elongate flexible member 16 out of the plane of the substrate 12 is effected by attaching the flexible member 16 near one end thereof to a pair of juxtaposed elongate elevation members 66 through compliant joints 68 which can be about 1 µm wide and formed from the Poly-2 or Poly-3 layers. The other end of each elevation member 66 is connected to an anchor point 70 on the substrate 12. The anchor point 70, which can comprise a flexible joint 72 as shown in FIGS. 7A and 7B, allows each elevation member 66 to be rotated out of the plane of the substrate 12 about the anchor point 70 as the end of the flexible member 16 connected to the output end 60 of the displacement multiplier 46 is moved in the plane of the substrate 12 in the direction indicated by the large arrow in FIG. 6. The resultant elevation of the end of the flexible member 16 connected to the elevation members 66 out of the plane of the substrate 12 is used to elevate or tilt the platform 14 and is schematically illustrated in the cross-section views of FIGS. 7A and 7B taken along the section line 4—4 in FIG. 6.

Those skilled in the art will recognize that the MEM actuator 18 of FIG. 6 and other actuators described herein as producing vertical motion can be used for many different applications of microelectromechanical devices wherein a displacement provided by an actuator that is substantially in the plane of the substrate is to be converted into a displacement that is in a direction substantially perpendicular to the substrate.

In FIG. 7A, the elevation members 66 and the flexible member 16, which can be initially fabricated as planar structures by patterning the Poly-2 and Poly-3 layers, respectively, can be initially elevated above the substrate 12 with the platform 14. This can be done in several ways. For example, a plurality of elongate pre-stressed members 74 as described in detail hereinafter (see FIGS. 4 and 8A–8C) can be fabricated underneath the platform 14 to urge the platform 14 upward away from the substrate 12 after the etch-release step and after the severing of any fuses 86 or disengagement of any restraining clips 88 which can be used to initially lock the platform 14 in place. As another example, one or more electrostatically actuated pry bars 30 can be used to pry the platform 14 and associated flexible members 16 upward away from the substrate 12 as described previously with reference to FIGS. 2A–2C. As yet another example, a micromanipular probe tip can be used to operate a mechanical latch 96 to displace one end of the flexible member 16 and to lock that end of the flexible member 16 in place in an initial elevated position, thereby anchoring that end of the flexible member 16 to the substrate 12. Such a mechanical latch 96 will be described in detail hereinafter (see FIGS. 12A and 12B and 14A and 14B).

Once the flexible member 16 and elevation members 66 are in their initial elevated positions as shown schematically in FIG. 7A, further movement of the end of the flexible member 16 connected to the MEM actuator 18 over a distance, Δx, in the plane of the substrate 12 (indicated by the horizontal arrow) will result in a further elevation, Δh, of the other end of the flexible member 16 as shown in FIG. 7B. This increase in elevation results from the elevation members 66 being rotated about the anchor point 70 while being flexibly connected to the member 16 by the compliant joints 68. By controlling the voltages applied to each MEM actuator 18 in FIG. 4, which comprises a pair of the electrostatic comb actuators 44 operating in tandem, the elevation or tilt of the platform can be controlled and changed. For example, for a 1600 µm long flexible member 16 initially elevated to a height of 350 µm and connected to a pair of elevation members 66 which are each 800 µm long, movement of the end of the flexible member 16 connected to the MEM actuator 18 by a distance Δx=50 µm will result in a change in elevation of Δh of approximately 175 µm. A 175 µm change in elevation on one side of a 1000 µm wide platform 14 can be used to produce a 10° tilt of the platform 14.

Figure 8A:
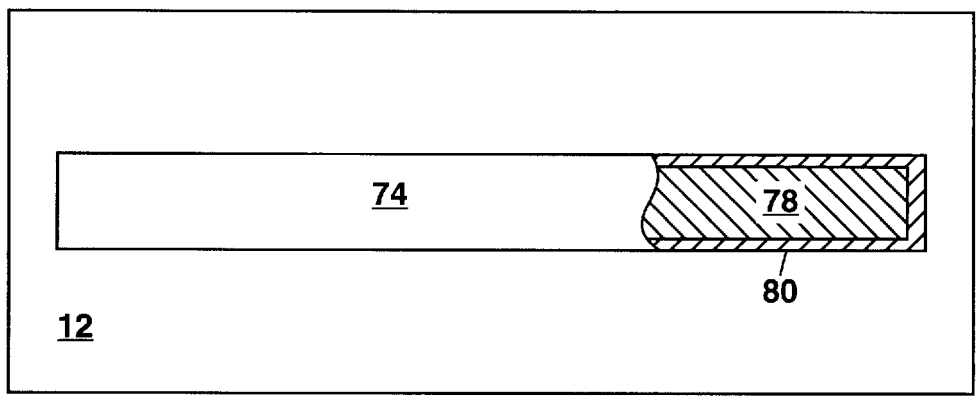
FIG. 8A shows a schematic plan view of a pre-stressed member during fabrication thereof, including a cut-away view showing the body and core of the pre-stressed member.
Figure 8B:
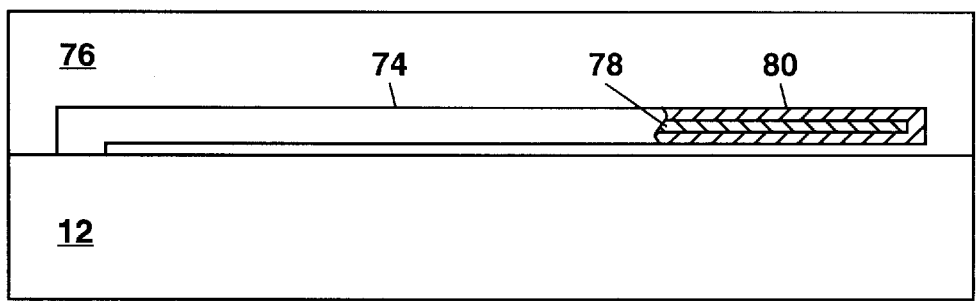
FIG. 8B shows a schematic side view of the pre-stressed member of FIG. 8A during fabrication.
Figure 8C:
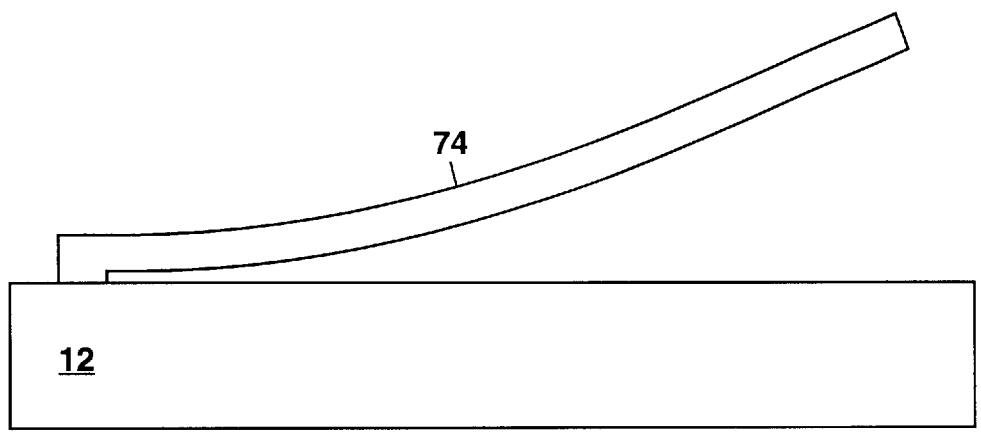
FIG. 8C shows upward bending of the pre-stressed member due to a stress gradient therein after removal of the surrounding sacrificial oxide.

FIGS. 8A–8C illustrate formation of the pre-stressed members 74 used in FIG. 4 for the initial elevation of the platform 14 and elements connected thereto. FIG. 8A shows a plan view of one of the pre-stressed members 74 during fabrication and prior to the etch-release step, with the pre-stressed member 74 being embedded in layers of a sacrificial oxide 76 and anchored at one end thereof to the substrate 12.

Cut-away views in FIGS. 8A and 8B show the structure of the pre-stressed member 74 which comprises an elongate core 78 of an oxide material, which generally has the same composition as the sacrificial oxide 76 and which can be, for example, 0.5 µm thick, completely encased within a polysilicon body 80 which can be formed from a pair of deposited and patterned polysilicon layers (e.g. the Poly-1 layer which can be 1 µm thick, and the Poly-2 layer which can be 1.5 µm thick) that are connected together through an annular trench formed in the intervening layer of the sacrificial oxide 76 (i.e. by depositing the Poly-2 layer in the trench and thereby connecting the Poly-2 layer to the Poly-1 layer at the edges of the pre-stressed member 74).

By being completely encased within the polysilicon body 80, the core 78 is not removed during the etch-release step which etches away the remainder of the sacrificial oxide 76. As a result, a stress gradient produced along the thickness of the pre-stressed member 74 by the combination of the oxide material in the core 78 and the polysilicon body 80, which have different layer thicknesses on each side of the oxide core 78, acts to bend the unanchored end of the pre-stressed member 74 out of the plane of the substrate 12 to accommodate the stress gradient when the surrounding sacrificial oxide 76 is removed during the etch-release step. Each pre-stressed member 74 thus forms a compressed spring which provides an upward-directed force on the overlying platform 14 to urge the platform 14 to move upward and away from the substrate 12. The pre-stressed members 74 need not be attached to the platform 14. In other embodiments of the present invention, the pre-stressed member 74 can be formed as a spiral to form a compressed coiled spring upon release by removing the surrounding sacrificial oxide 76. Although the pre-stressed members 74 are shown located beneath the platform 14 to save space, in other embodiments of the present invention, the pre-stressed members 74 can be located at least partially outside the platform 14 with the unanchored end of each pre-stressed member 74 contacting the underside of the platform 14 to urge it upward.

Generally, it is preferable to have the platform 14 secured to the substrate 12 during the etch-release step and immediately afterwards. This is advantageous to prevent possible adhesion of the platform 14 to the substrate 12 during the etch-release step, or to permit deposition of a mirror coating 24 on the platform after the etch-release step. One way of securing the platform 14 to the substrate 12 is by providing a plurality of fuses 82, which can be arranged in pairs as shown in FIG. 4 to anchor the platform 14 to the substrate 12. To release the platform 14 for movement, the fuses 82 can be electrically severed. Alternately, a plurality of removable restraining clips 88 can be used to secure the platform 14 in place until the clips 88 are electrically or mechanically disengaged (see FIGS. 10A and 10B).

Figure 9A:
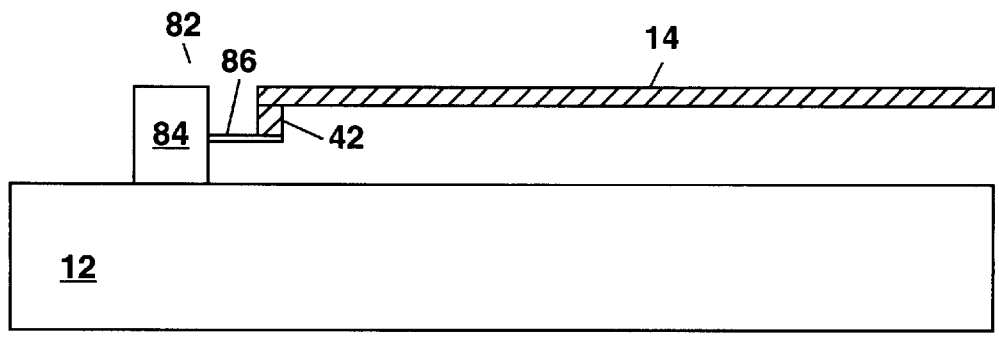
FIG. 9A shows a schematic cross-section view along the section line 5—5 in FIG. 4 to illustrate attachment of the platform to the substrate using a fuse.
Figure 9B:
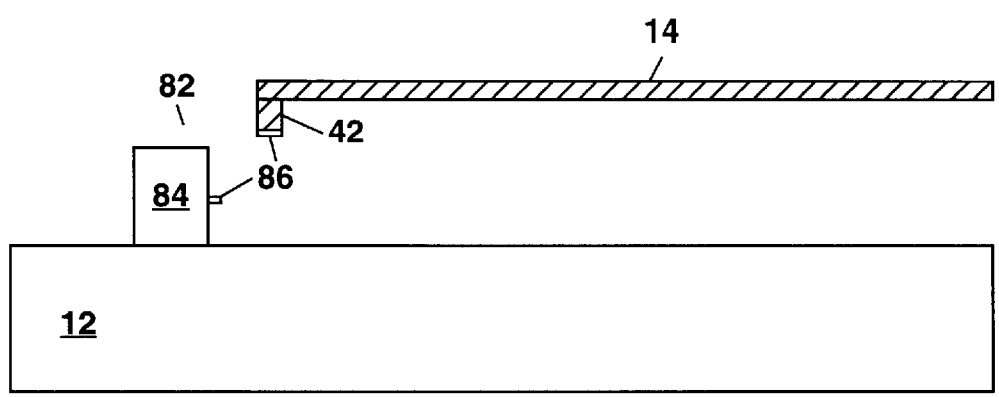
FIG. 9B illustrates release and upward movement of the platform of FIG. 9A after electrical severing of the fuse.

FIGS. 9A and 9B show schematic cross-section views along the section line 5—5 in FIG. 3 before and after electrical severing of the fuses 82, respectively, to illustrate operation of the fuses 82 which can be used to hold the platform 14 securely in place during the etch-release step. In FIG. 9A, each fuse 82 comprises an electrical probe pad 84 insulated from the substrate 12 by the thermal oxide and silicon nitride layers (not shown) initially formed on the substrate 12 as described previously. A fusible link 86 (i.e. a filament) connects each probe pad 84 to the periphery of the platform 14. This can be done, for example, by connecting each fusible link 86 to one of the arcuate polysilicon portions 42 or alternately to the underside of the platform 14 near the periphery. Each fusible link 86 can have cross-sectional dimensions of, for example, about 1–1.5 $\mu$m and a length of 20 $\mu$m. The probe pads 84 can be formed from the plurality of deposited and patterned layers of polysilicon (e.g. Poly-1 through Poly-3), while the fusible links 86 can be formed from a single layer of polysilicon (e.g. Poly-2 or Poly-3).

FIG. 9B shows the result of electrically severing each pair of fuses 82 supporting the platform 14. This electrical severing process (i.e. blowing the fusible links 86) can occur when a sufficiently large voltage or voltage pulse (e.g. up to 300 V) from a source or power supply (not shown) is applied across each pair of probe pads 84, or alternately between each probe pad 84 and the platform 14 which is maintained at ground electrical potential. The applied voltage or voltage pulse produces an electrical current sufficiently large to blow (i.e. melt or vaporize) each fusible link 86. When the fuses 82 securing the platform 14 to the substrate 12 are severed, the platform 14 is free to move upward away from the substrate 12 due to the action of the underlying pre-stressed members 74. The initial elevation of the platform 14 will depend upon the length and force of the pre-stressed members 74, and can be, for example, up to about one-third of the width of the platform 14. At this point, the elevation or tilt of the platform can be controlled and changed using the MEM actuators 18 as described previously.

Locating the fusible links 86 at a level lower than the platform can be advantageous to prevent the vaporized or melted polysilicon from the severed links 86 from being deposited on the upper surface (i.e. the topside) of the platform 14, especially when a mirror coating 24 has been provided on the platform 14 to increase its reflectivity to light. Additionally, it can be advantageous to sever the fusible links 86 using voltages of different polarity applied to each probe pad 84 (e.g. using a positive voltage or voltage pulse applied to one probe pad 84 and a negative voltage or voltage pulse applied to the other probe pad 84 of each pair of fuses 82). This can be done, for example, using an alternating-current (ac) power supply or pulse generator coupled to a primary coil of a transformer having a secondary coil with a center-tap connection to provide two opposite-polarity output voltage waveforms or pulses when the center-tap connection is electrically grounded. The provision of the opposite-polarity voltages or voltage pulses to each probe pad 84 can mitigate effects due to parasitic capacitance or parasitic current paths in the apparatus 10 and ensure that substantially the same electrical current is experienced at the same time in each fuse 82 of a particular pair. The exact magnitude of the voltages or voltage pulses will depend upon the dimensions of the fusible links 86 and can be learned from practice of the present invention.

Figure 10A:
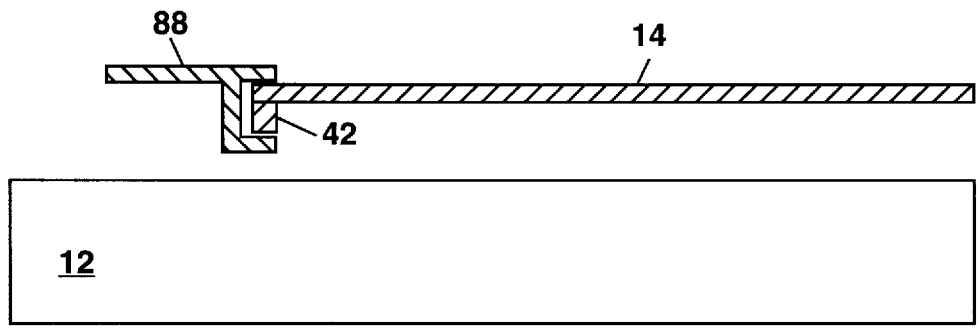
FIG. 10A shows a schematic cross-section view of a restraining clip for attaching the platform to the substrate.
Figure 10B:
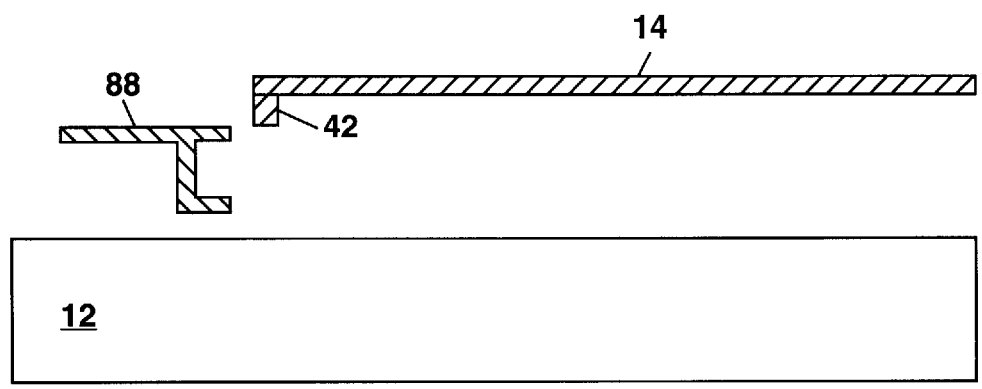
FIG. 10B illustrates release and upward movement of the platform of FIG. 10A after disengaging the restraining clip.
Figure 11:
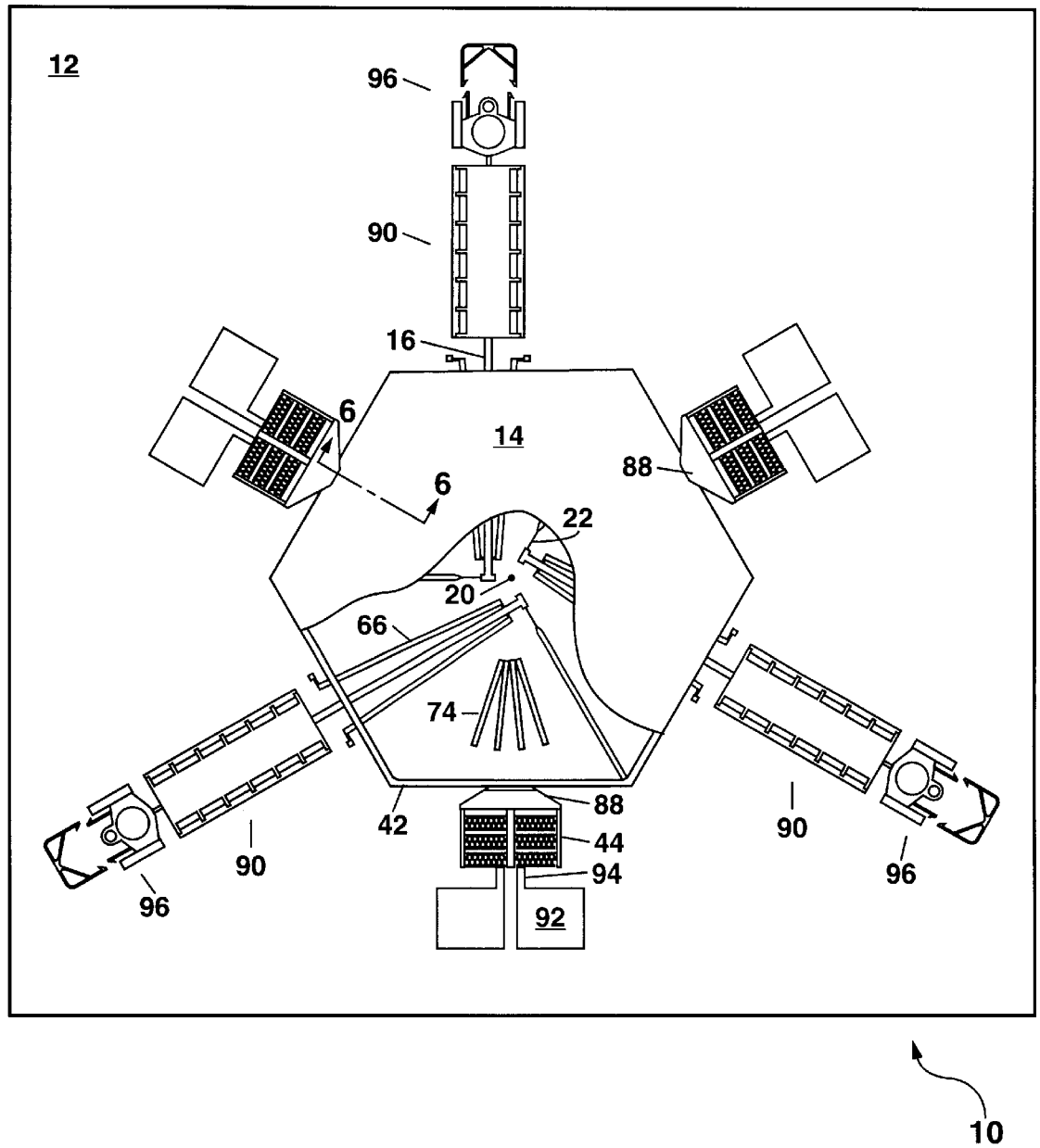
FIG. 11 shows a schematic plan view of a fourth embodiment of the present invention.

FIGS. 10A and 10B schematically illustrate, in cross-section view along the section line 6—6 in FIG. 11, an alternate way of attaching the platform 14 to the substrate 12 using a plurality of removable restraining clips 88 located about the periphery of the platform 14. Each restraining clip 88 can be formed from a plurality of layers of the deposited and patterned polysilicon (e.g. Poly-2 through Poly-4) during build-up of the apparatus 10, with a thin (e.g. 0.2–2 $\mu$m) layer of the sacrificial oxide (not shown) separating the restraining clip 88 from the platform 14 during fabrication of the apparatus 10. The sacrificial oxide is removed during the etch-release step leaving a narrow air gap between each restraining clip 88 and the platform 14.

To release the platform 14 for upward movement after the etch-release step, each restraining clip 88 can be slid away from the platform 14 as shown in FIG. 10B. This can be done, for example, by forming an electrostatic comb actuator 44 connected to each restraining clip 88 as shown in FIG. 11. Upon activation by applying a voltage across a pair of probe pads 92, the actuator 44 moves the restraining clip 88 away from the platform 14 thereby releasing the platform 14 to move upward by the action of the underlying pre-stressed members 74. When the actuation voltage is removed, the restraining clip 88 moves back to its initial position, but now underlies the platform 14 which has been elevated. The probe pads 92 in FIG. 11, which can comprise a deposited metallization, are connected to the electrostatic comb actuators 44 used to actuate the restraining clips 88 by interconnect wiring 94 which can be formed by patterning the Poly-0 layer. In other embodiments of the present invention, the restraining clips 88 can be operatively connected to a mechanical latch 96 as described hereinafter and moved away from the platform 14 using a micromanipulator probe tip.

FIG. 11 shows a schematic plan view of a fourth embodiment of the MEM apparatus 10 of the present invention. In FIG. 11, a plurality of MEM electrostatic actuators are spaced about a polygonal platform 14 which can be hexagonal in shape, with each electrostatic actuator in this embodiment being a vertical zip electrostatic actuator 90. A plurality of restraining clips 88 are spaced about the platform 14 to secure the platform 14 as previously described, although those skilled in the art will understand that fuses 82 described previously with reference to FIGS. 4 and 9A–9B can be substituted for the restraining clips 88.

Figure 12A:
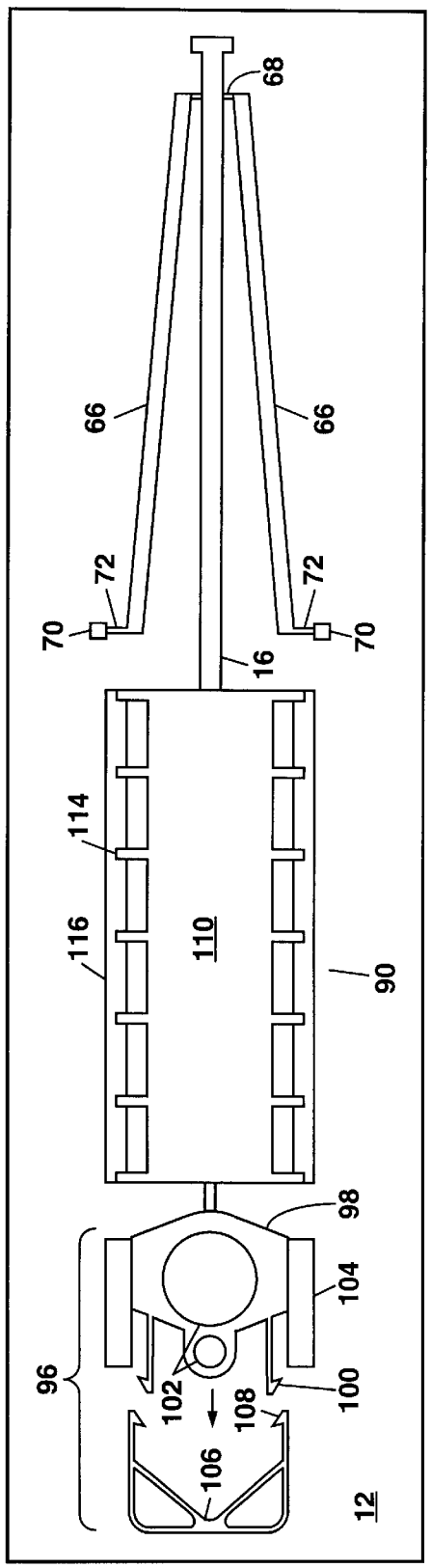
FIG. 12A shows an enlarged plan view of the vertical zip actuator of FIG. 11 prior to engagement of a mechanical latch to elevate the flexible member and elevation members.
Figure 12B:
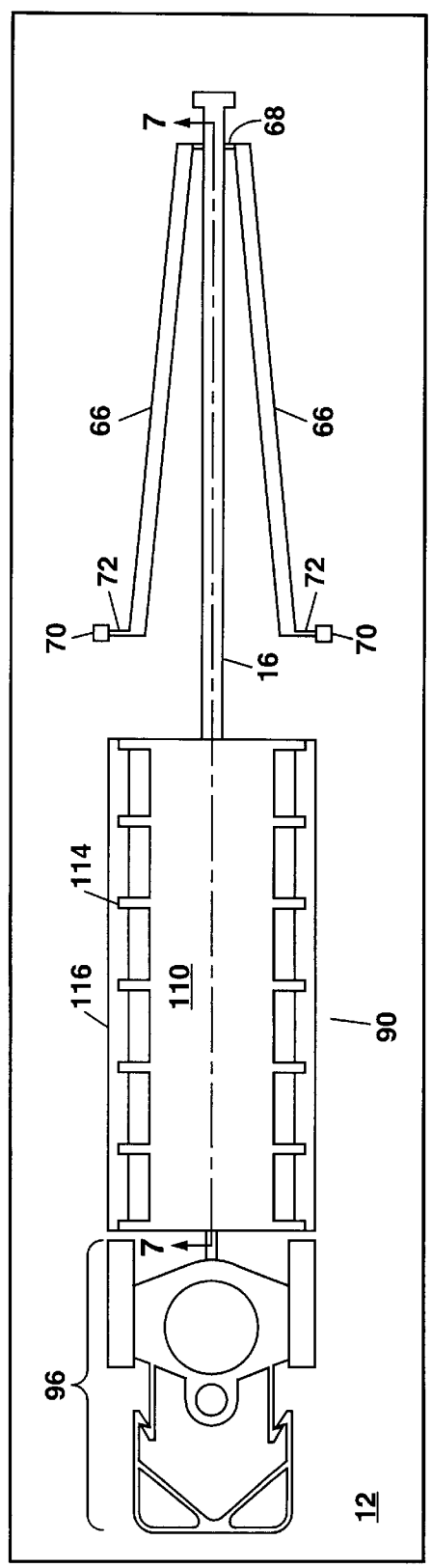

FIGS. 12A and 12B show enlarged plan views of the vertical zip actuator 90 of FIG. 11 which can be used to control the elevation and/or tilt of the platform 14 in the fourth embodiment of the present invention. FIG. 12A shows the vertical zip actuator 90 in an as-fabricated position immediately after the etch-release step, with the various layers of structural polysilicon used to form the actuator 90, the flexible member 16 and the elevation members 66 all being coplanar with the substrate 12. FIG. 12B shows the vertical zip actuator 90 in an operating position (i.e. the initial elevated position) with the flexible member 16 and the elevation members 66 being bent upwards out of the plane of the substrate 12. This can be done by an operator using a micromanipulator probe (not shown) to slide the mechanical latch 96 that is connected to the vertical zip actuator 90 and the members 16 and 66 from the initial fabricated position as shown in FIG. 12A into a locked position as shown in FIG. 12B.

Figure 13A:
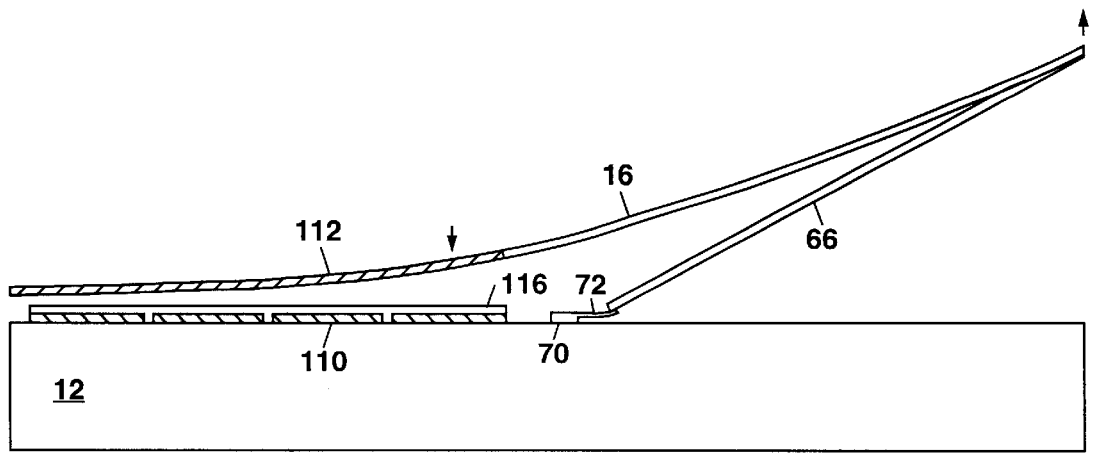
FIGS. 13A and 13B show schematic cross-section views along the section line 6—6 in FIG. 12B to illustrate use of the vertical zip actuator to change the elevation of flexible member and elevation members, thereby elevating or tilting the platform.

The mechanical latch 96 comprises a moveable body 98 with a first set of barbs 100 and one or more holes 102 sized to receive the tip of the micromanipulator probe. A pair of guides 104 attached to the substrate 12 enable movement of the body 98 in a preferred direction (indicated by the arrow in FIG. 12A). The latch 96 further includes a stationary body 106 which is attached to the substrate 12 and has a second set of barbs 108 which engage the first set of barbs 100 to anchor the vertical zip actuator 90 and the flexible member 16 to the substrate 12 in the operating position as shown in FIG. 13A which is a schematic cross-section view along section line 7—7 in FIG. 12B. Further elevation or tilting of the platform 14 can then be performed electrically by providing an actuation voltage from a source or power supply to the vertical zip actuator 90. In FIGS. 12A and 12B, the mechanical latch 96 can be formed from the same polysilicon layers used to form the remainder of the apparatus 10 (e.g. the body 98 can be formed from Poly-2 and Poly-3; the barbs 100 and 108 can be formed from Poly-2, Poly-3 or both; and the guides 104 can be formed from Poly-1 through Poly-4).

The vertical zip actuator 90 in FIGS. 12A and 12B comprises one or more first electrodes 110 supported on the substrate 12 (e.g. formed in the Poly-0 layer and insulated from the substrate 12 by the intervening silicon nitride and thermal oxide layers), and a second electrode 112 superposed above the first electrodes 110 (e.g. formed from Poly-1, Poly-2 or Poly-3) and anchored to the substrate 12 through the mechanical latch 96. Each first electrode 110 can be connected to a separate bond pad 92 (not shown) through wiring 94 which can be formed by patterning the Poly-0 layer to allow separate addressing and control of each first electrode 110. The second elctrode 112 can be maintained at ground electrical potential by an electrical connection to the substrate 12 through the flexible member 16 and the elevation members 66.

Figure 13B:
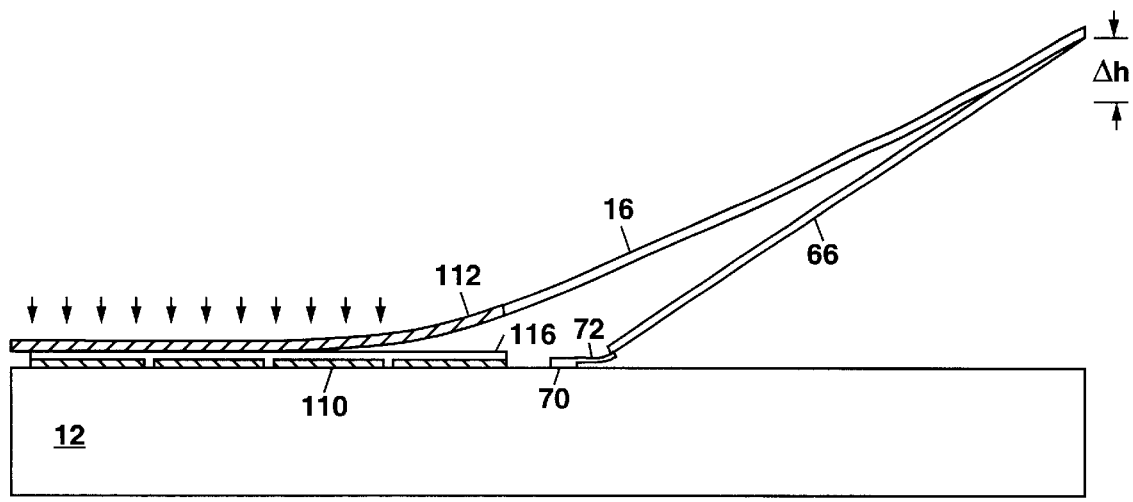

The vertical spacing between the first and second electrodes, 110 and 112, varies along the length of the actuator 90 as shown schematically in FIG. 13A. The application of an actuation voltage between the one or more of the first electrodes 110 and the second electrode 112 produces an electrostatic force of attraction along a portion of the actuator 90 as indicated by the multiple vertical arrows in FIG. 13B. This force of attraction urges the second electrode 112 towards the first electrode 110, with the shape assumed by the second electrode 112 being determined by the magnitude and location of the force of attraction. As the second electrode 112 moves downwards, it exerts a force on the end of the flexible member 16 to which it is connected, thereby moving the other end of the flexible member 16 upward by a distance, Δh, as shown in FIG. 13B and pivoting the elevation members 66 about the anchor point 70 to which they are connected by the flexible joint 72. The exact upward movement of the flexible member 16, which is responsible for elevating or tilting the platform 14, will depend upon the number and location of the first electrodes 110 being activated and upon the magnitude of the actuation voltage (e.g. 10–200 volts). To prevent electrical short circuiting of the first and second electrodes 110 and 112, a plurality of tabs 114 can be formed on the sides of the second electrode 112 to engage with stops 116 formed on the substrate 12 (e.g. comprising a deposited and patterned layer of silicon nitride) to limit further downward movement of the second electrode 112 and establish a minimum separation distance between the electrodes 110 and 112.

An advantage of providing a plurality of first electrodes 110 is that the elevation or tilt of the platform 14 can be precisely and repeatably controlled by addressing one or more of the first electrodes 110 with a fixed-magnitude actuation voltage. This can be useful, for example, when a mirror coating 24 is provided on the upper surface of the platform 14 in the device 10 of FIG. 11 for redirecting an incident light beam 200 from an input optical fiber (not shown) to a particular output fiber (not shown) contained within an array or bundle of output optical fibers. Each individual optical fiber in the output array or bundle can be addressed by selecting a particular set of first electrodes 110 which upon actuation will provide the required angle of tilt needed to redirect the incident light beam 200 from the input optical fiber to the selected output optical fiber. This establishes a line of communication between the input optical fiber and the output optical fiber for information transfer. Establishing and switching different lines of communication over time can be performed electronically using a computer, thereby providing a high-speed optical signal routing capability which is useful for local area networks or long distance telephone and data communications.

Figure 14A:
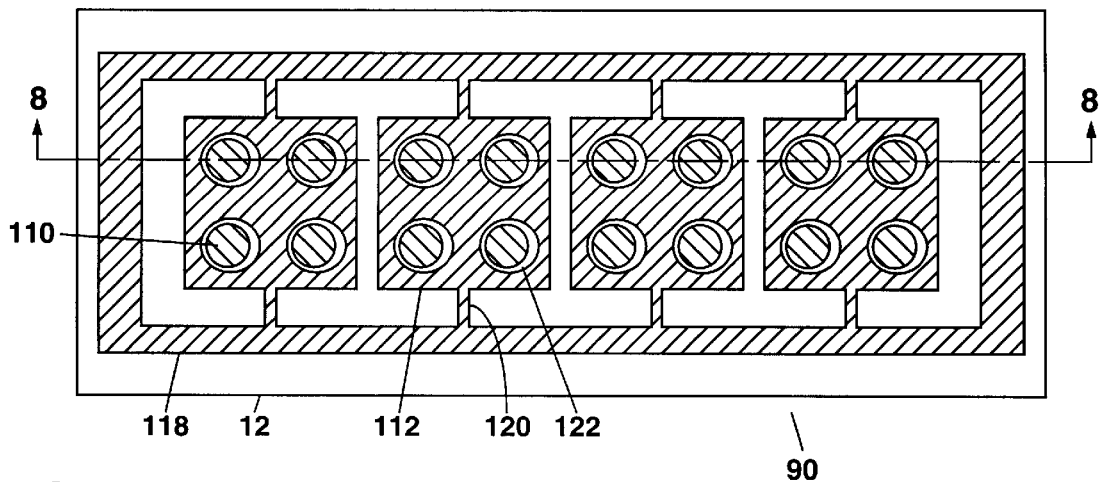
FIG. 14A shows a schematic plan view of an alternative contact-free vertical zip actuator.

In some cases, it is desirable for reliability considerations to prevent contact between the second electrode 112 and any other element (e.g. the stops 116) of the apparatus 10 since such contact can possibly lead to adhesion of the contacting elements. An alternative vertical zip actuator 90 which is contact-free is shown schematically in FIGS. 14A–14C. Here, a plurality of second electrodes 112 can be supported on a framework comprising a pair of flexible rails 118 to which the second electrodes 112 are attached with torsional springs 120. The framework can be anchored to the substrate 12 and electrically grounded through a mechanical latch 96, or alternately through one or more support posts. In FIG. 14A, a plurality of openings 122 are formed in each second electrode 112, with each opening 122 being sized slightly larger than a mating first electrode 110. Contact between the first electrodes 110 and the second electrodes 112 is avoided since each first electrode 110 fits into one of the openings 122 in a superposed second electrode 112.

Figure 14B:
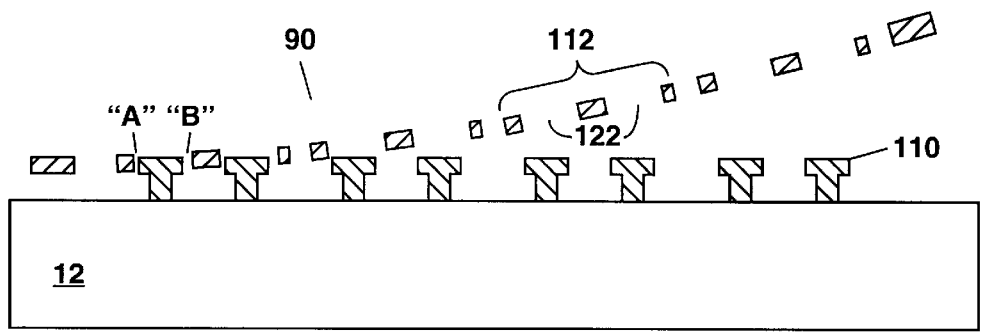
FIGS. 14B and 14C illustrate operation of the contact-free vertical zip actuator of FIG. 14A.
Figure 14C:
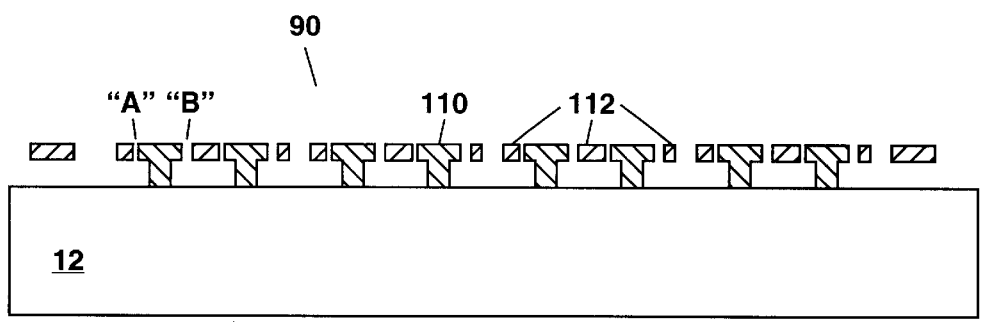

The first electrodes 110 can be slightly offset from the openings 122 as shown in FIGS. 14B and 14C to provide a gap labelled "A" on a left side of each first electrode 110 that is smaller than a gap labelled "B" on the right side of the electrode 110. As an example, the gap "A" can be 1 μm when the gap "B" is 1.5 μm. The narrower gap "A" will generate a stronger horizontal component to the electrostatic force of attraction than will be generated at the gap "B" when an actuation voltage is applied between the first and second electrodes, 110 and 112. This force will act to pull the second electrodes 112 and rails 118 to the right thereby putting these elements in tension thereby preventing any sagging of the second electrodes 112.

Increasing the magnitude of the actuation voltage pulls the second electrodes 112 downward towards their corresponding first electrodes 110 as shown in FIGS. 14A and 14B. When the contact-free vertical zip actuator 90 is operatively connected to one end of the flexible member 16 as shown in FIGS. 13A and 13B, this motion of the actuator 90 can be used to change the elevation of the other end of the flexible member 16. Once sufficient actuation voltage has been applied to align a particular set of electrodes 110 and 112 (i.e. a second electrode 112 and the four corresponding first electrodes 110 in FIG. 14A) in the same plane, the electrostatic force of attraction is greatest so that no further downward movement of that second electrode 112 will occur. Increasing the actuation voltage will bring additional second electrodes 112 into alignment with their corresponding first electrodes 110 until all the electrodes 110 and 112 are coplanar as shown in FIG. 14C. Supporting the second electrodes 112 with the torsional springs 120 increases the flexibility of the rails 118 and permits limited torsional motion of the second electrodes 112.

Figure 15A:
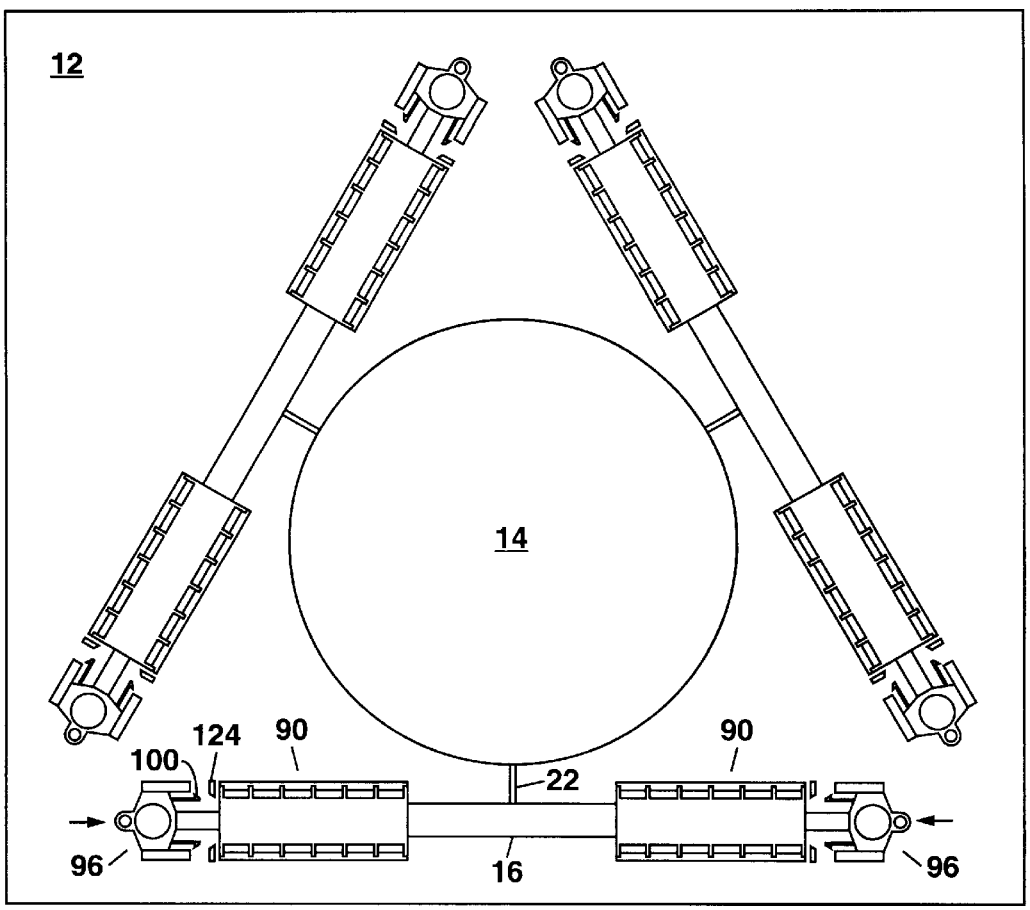
FIG. 15A shows a schematic plan view of a fifth embodiment of the present invention.
Figure 15B:
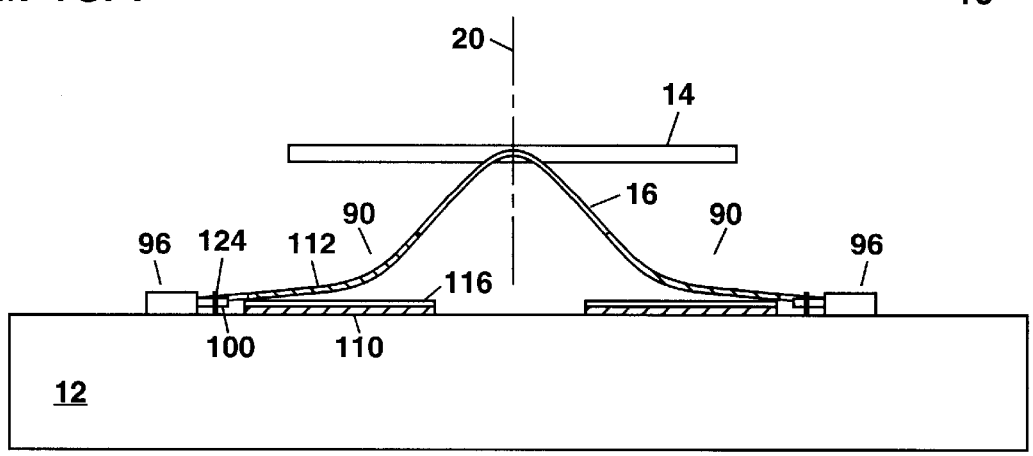
FIG. 15B shows a side view of the device of FIG. 15A after engagement of the mechanical latches to elevate the platform.
Figure 15C:
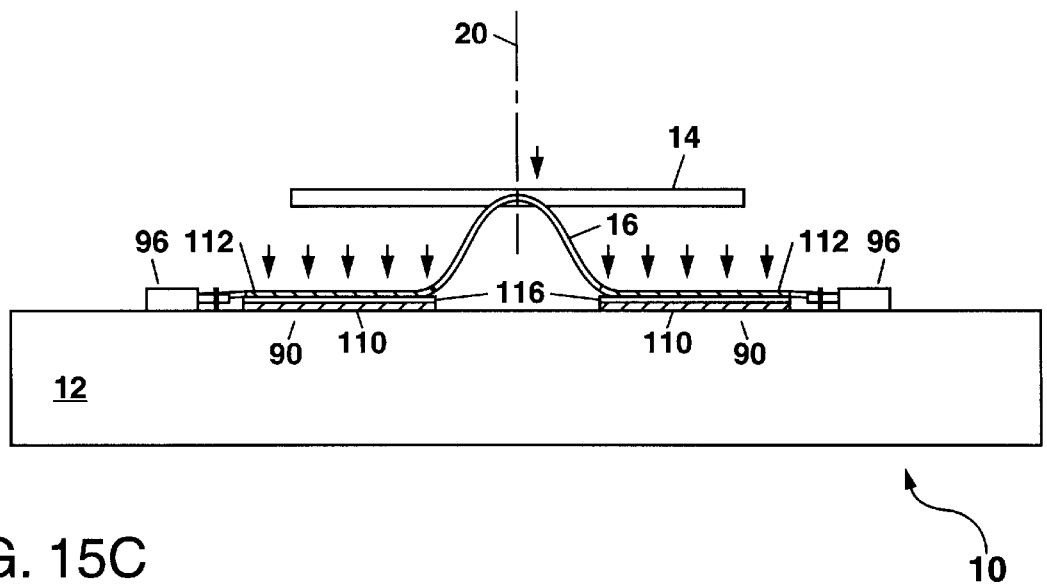
FIG. 15C shows a side view of the device of FIGS. 15A and 15B after applying an actuation voltage to the vertical zip actuator to change the elevation on one side of the platform.

In a fifth embodiment of the apparatus 10 of the present invention shown schematically in FIGS. 15A–15C, a pair of vertical zip actuators 90 can be connected together end to end to form an apparatus 10 similar to that of FIGS. 1A and 1B except with vertically-directed actuation forces. FIG. 15A shows a schematic plan view of the fifth embodiment of the apparatus 10 after fabrication of the device with each element being substantially coplanar with the substrate. In the schematic side view of FIG. 15B, the platform 14 can be raised to its initial elevated position by using a micromanipulator probe to actuate each mechanical latch 96 and move the body 98 therein so that the barbs 100 move past a pair of posts 124 to lock the vertical zip actuator 90 in the operating position. This movement of the mechanical latch 96, which is directed opposite that described previously with reference to FIGS. 12A and 12B, compresses the flexible member 16 thereby elevating the member 16 out of the plane of the substrate 12 and raising the platform 14 as shown in FIG. 15B. A plurality of pre-stressed members 74 as described previously can optionally be located underneath the platform 14 to aid in raising the platform 14 to the initial elevated position (see FIGS. 4 and 8A–8C). Alternately, a plurality of pry bars 30 can be located about the platform 14 to aid in elevating it.

In FIG. 15C, once the platform 14 has initially been elevated to an operating position, further elevation or tilt of the platform 14 can generated by applying an actuation voltage to each connected pair of vertical zip actuators 90 thereby changing the height of one or more of the flexible members 16. This actuation voltage can be applied between the first and second electrodes, 110 and 112, with the second electrodes generally being held at ground electrical potential by being connected to the substrate 12. Changing the activation voltage produces a vertically-directed electrostatic force of attraction (indicated by the multiple downward-directed arrows in FIG. 15C) between the first and second electrodes, 110 and 112, which moves the flexible member 16 downward thereby decreasing the elevation of the side of the platform 14 to which the flexible member 16 is connected by the compliant member 22. Similarly, decreasing the actuation voltage reduces the force of attraction and raises the flexible member 16 which behaves like a leaf spring. The angle of tilt of the platform 14 and the direction of the central axis 20 thereof can be controlled by addressing different pairs of the vertical zip actuators 90 with the same or different actuation voltages. Multiple first electrodes 110 can be optionally provided for each vertical zip actuator 90 as described previously with reference to FIGS. 13A and 13B. In other embodiments of the apparatus 10 of the present invention, the vertical zip actuators 90 can be formed as described with reference to FIGS. 14A–14C.

Figure 16B:
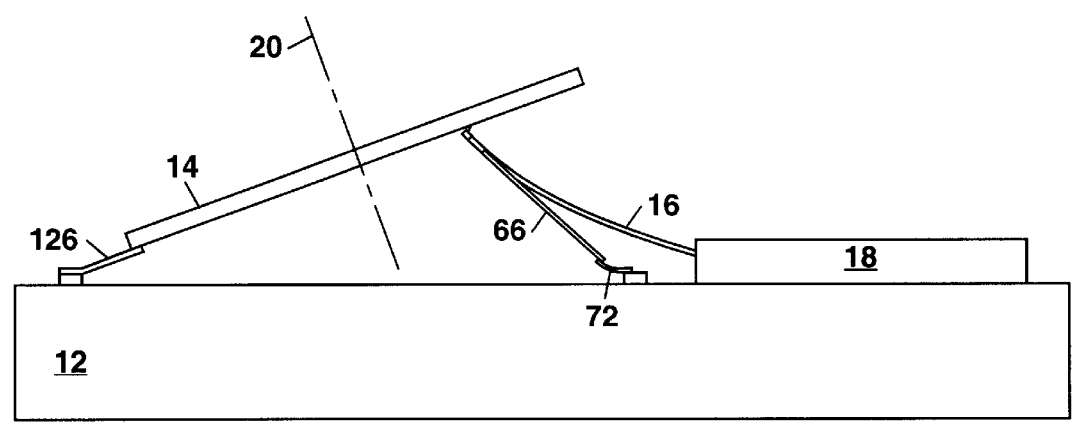

FIGS. 16A and 16B show a schematic plan view and a side view, respectively, of a sixth embodiment of the apparatus 10 of the present invention which can be used to form a tiltable platform 14 without each side of the platform 14 being initially elevated above the substrate 12 by a significant fraction of the width of the platform 14. In this embodiment of the invention, the platform 14 is attached to the substrate 12 on one side by one or more flexible hinges 126 which are anchored to the substrate 12. Each hinge 126 can be, for example, 1–2 μm thick and wide and 5–50 μm long, and can have a serpentine shape to save space. The hinges 126 can be formed, for example, from the Poly-2 or Poly-3 layers and anchored to the substrate 12 through the underlying polysilicon layers.

The provision of the flexible hinges 126 on one side of the platform 14 allows the platform 14 to be tilted using only two MEM actuators 18. The MEM actuators 18, which can be electrostatic comb actuators 44 as shown in FIG. 6, are connected to the periphery of the platform 14 through a pair of compliant members 22. The MEM actuators 18 can be operated in tandem to tilt the platform 14 in a single direction, with the central axis 20 of the platform 14 defining a plane of tilt angles (i.e. a range of tilt angles aligned in a plane that will generally be substantially perpendicular to the plane of the substrate 12). Alternately, the MEM actuators 18 can be independently operated to permit tilting of the platform 14 in two orthogonal directions, thereby defining a cone of tilt angles (i.e. a range of tilt angles falling within a cone).

The platform 14 can optionally include a mirror coating 24, a stress-compensation coating 26 or both as described previously with reference to FIGS. 1C and 1D. With a mirror coating 24, the apparatus 10 of FIGS. 16A and 16B can be used to form a tiltable mirror or a pop-up mirror for use in redirecting a light beam 200. An array of devices 10 can be formed on a common substrate for use in optical switching or beam scanning applications.

To secure the platform 14 in FIGS. 16A and 16B to the substrate 12 immediately after the etch-release step, a plurality of fuses 82 or mechanical latches 88 can be provided about the periphery of the platform 14 as described previously. Also, to aid in initially elevating the platform 14 out of the plane of the substrate 12, a plurality of pre-stressed members 74 can be located underneath the platform 14 as described with reference to FIGS. 4 and 8A–8C. Alternately, a plurality of electrostatically actuated pry bars 30 can be formed about the platform 14 as described with reference to FIGS. 2A–2C. It should be noted that generally only a pair of the fuses 82, latches 88 or pry bars 30 are needed since the flexible hinge 126 anchors one side of the platform 14 to the substrate 12.

Figure 17:
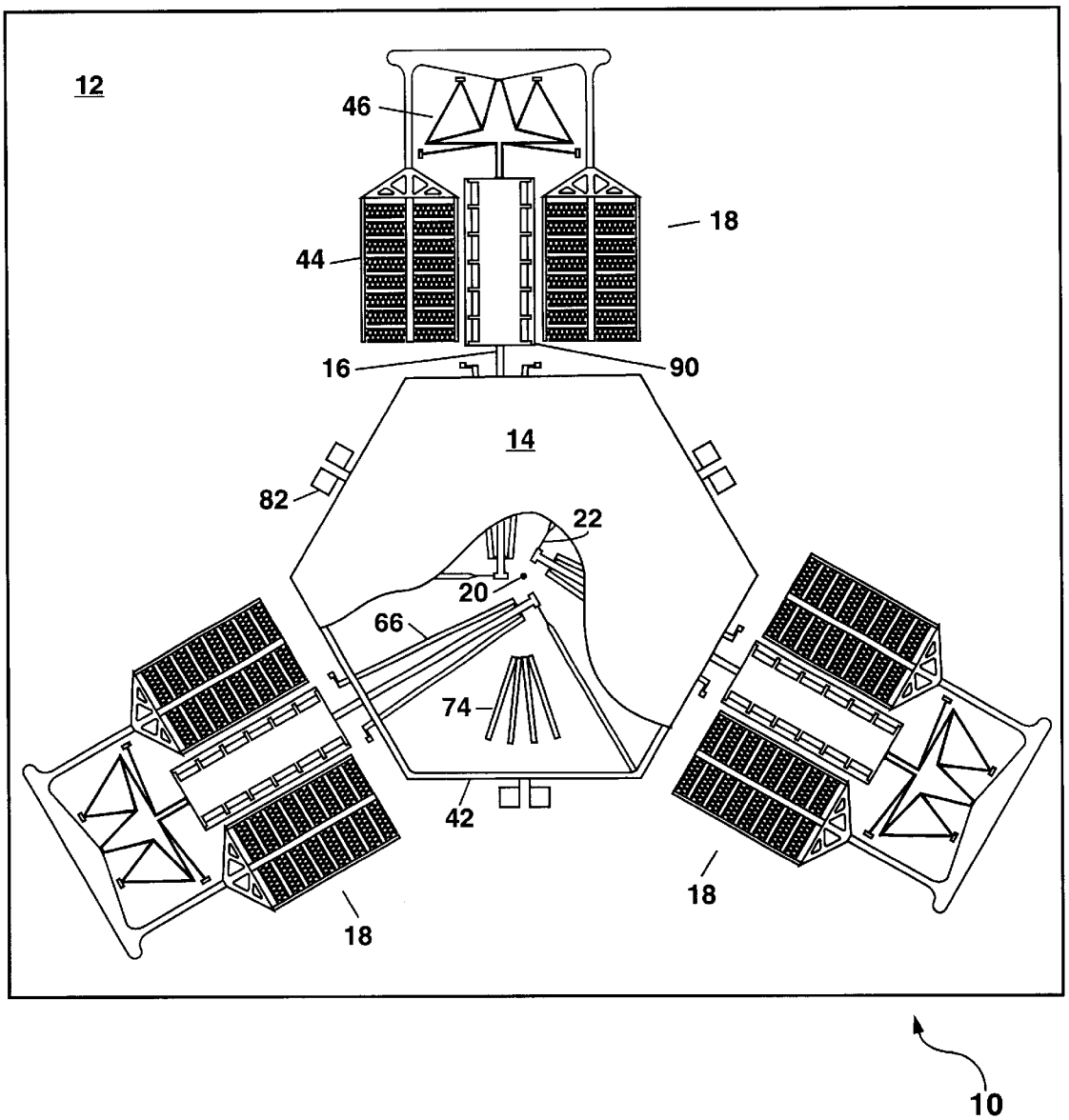
FIG. 17 shows a seventh embodiment of the present invention incorporating features from the devices of FIGS. 4 and 11.

Other embodiments of the present invention are possible based on the teachings herein. For example, a vertical zip actuator 90 can be connected between the displacement multiplier 46 and the flexible member 16 in the device 10 of FIG. 4 so that the electrostatic comb actuators 44 can be used to initially elevate the platform 14 by pulling on one side of the vertical zip actuators 90 and the flexible member 16. This is shown schematically in FIG. 17 as a seventh embodiment of the apparatus 10 of the present invention. The vertical zip actuators 90 can then be used to provide fine adjustments to the elevation or tilt of the platform 14, or to provide addressing for precise and repeatable positioning of the platform 14.

Furthermore, those skilled in the art will understand that a plurality of devices 10 can be formed on a common substrate 12 and arrayed to form a plurality of platforms 14 that can be elevated or tilted (e.g. for redirecting a plurality of incident light beams 200). The plurality of devices 10 can be arranged so that the MEM actuators 18 for one device 10 at least partially underlie the platform 14 of the same or a different device 10 (e.g. to increase a fill factor of an array of mirrors formed by the devices 10). Square or hexagonal platforms 14 can be used in the array to provide a close-packed arrangement with a high fill factor. Such an apparatus comprising a plurality of devices 10 has applications for forming a programmable array of mirrors (also termed micromirrors) for use in forming a projection display, or for use in redirecting or switching a plurality light beams in free space or between optical fibers. An array of programmable mirrors also has applications for forming a large-area deformable mirror (e.g. to correct phase abberations, or to process one or more light beams).

Other applications and variations of the present invention will become evident to those skilled in the art. For example, the apparatus 10 can be used to support a lens or diffractive optical element on the platform 14 to transmit light through an opening in the platform 14. Such a device 10 has applications for forming a focusing lens mount in which all flexible members can be operated in unison to change the elevation of the platform without tilting thereof. A focusing lens mount formed by the apparatus 10 is useful, for example, in a device for reading out or recording information on a compact disk (CD), or on a digital video disk (DVD). As another example, the apparatus 10 can be used to support an optical polarizer on the platform 14, with the platform 14 being rotatable over an angle by a displacement of one or more of the flexible members 16 (see FIGS. 7A and 7B), thereby rotating the optical polarizer and controlling the polarization of an incident light beam 200 transmitted through the optical polarizer. The intensity of the incident light beam 200 can also be controlled by placing a second linear polarizer in the path of the incident light beam 200 so that a polarization axis of the second linear polarizer differs from that of the polarizer supported on the platform 14.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A microelectromechanical apparatus, comprising:
   (a) a substrate;
   (b) a platform supported above the substrate by a trio of flexible members, with each flexible member being connected to the platform by a compliant member, and with an end of each flexible member connected to the compliant member further being connected to a pair of elongate elevation members further being anchored to the substrate; and
   (c) means for bending each flexible member, thereby changing the elevation or tilt of the platform.

2. The apparatus of claim 1 wherein the substrate comprises silicon.

3. The apparatus of claim 1 wherein the platform comprises monocrystalline or polycrystalline silicon.

4. The apparatus of claim 1 wherein each flexible member is equidistantly spaced about the platform.

5. The apparatus of claim 1 wherein another end of each flexible member is anchored to the substrate.

6. The apparatus of claim 1 wherein the platform is circular or polygonal.

7. The apparatus of claim 1 wherein the platform is planar.

8. The apparatus of claim 1 wherein the platform has a curved surface.

9. The apparatus of claim 1 wherein a surface of the platform includes a mirror coating.

10. The apparatus of claim 9 wherein another surface of the platform includes a stress-compensation coating formed thereon.

11. The apparatus of claim 1 wherein the means for bending each flexible member comprises a microelectromechanical actuator operatively connected to the flexible member.

12. The apparatus of claim 11 wherein the microelectromechanical actuator comprises an electrostatic actuator.

13. The apparatus of claim 1 wherein the pair of elevation members are anchored to the substrate by a flexible joint.

14. A microelectromechanical apparatus, comprising:
   (a) a substrate;
   (b) a platform supported above the substrate by a trio of flexible members, with each flexible member being connected to the platform by a compliant member which is connected at one end thereof near a midpoint of one of the flexible members, and is connected at the other end thereof to an outer edge of the platform; and
   (c) means for bending each flexible member, thereby changing the elevation or tilt of the platform.

15. A microelectromechanical apparatus, comprising:
   (a) a substrate;
   (b) a platform supported above the substrate by a trio of flexible members, with each flexible member being connected to the platform at one end thereof by a compliant member which is connected at one end thereof proximate to an end of one of the flexible members, with the other end of each compliant member being connected to the platform at a point equidistant from a central axis of the platform; and
   (c) means for bending each flexible member, thereby changing the elevation or tilt of the platform.

16. A microelectromechanical apparatus, comprising:
   (a) a substrate;
   (b) a platform supported above the substrate by a trio of flexible members; and
   (c) an electrostatic comb actuator for bending each flexible member, thereby changing the elevation or tilt of the platform, with the electrostatic comb actuator further comprising a plurality of stationary electrostatic combs attached to the substrate and a plurality of moveable electrostatic combs attached to a frame supported above the substrate, with the moveable electrostatic combs being moveable towards the stationary electrostatic combs in response to an actuation voltage provided therebetween.

17. A microelectromechanical apparatus, comprising:
   (a) a substrate;
   (b) a platform supported above the substrate by a trio of flexible members; and
   (c) an electrostatic vertical zip actuator for bending each flexible member, thereby changing the elevation or tilt of the platform, with the vertical zip actuator further comprising at least one first electrode supported on the substrate and a second electrode superposed above the first electrode with a spacing between the first and second electrodes being variable along the length of the superposed first and second electrodes, and with the second electrode being moveable towards the first electrode in response to an actuation voltage provided therebetween.

18. The apparatus of claim 17 wherein one end of the second electrode is connected to the flexible member, and the other end of the second electrode is anchored to the substrate.

19. A microelectromechanical apparatus, comprising:
   (a) a substrate;
   (b) a platform supported above the substrate by a trio of flexible members;
   (c) a plurality of pre-stressed members underlying the platform, with each pre-stressed member being anchored at one end thereof to the substrate, and with the other end of each pre-stressed member providing a force on the platform to urge the platform upward from the substrate; and (d) means for bending each flexible member, thereby changing the elevation or tilt of the platform.

20. The apparatus of claim 19 wherein each pre-stressed member comprises an oxide material encased within a polysilicon body for producing a stress gradient in the pre-stressed member.

21. A microelectromechanical apparatus, comprising:
   (a) a substrate;
   (b) a platform supported above the substrate by a trio of flexible members;
   (c) a plurality of restraining clips for holding the platform in place during fabrication thereof, with the restraining clips being moveable away from the platform to release the platform for movement thereof; and
   (d) means for bending each flexible member, thereby changing the elevation or tilt of the platform.

22. A microelectromechanical apparatus, comprising:
   (a) a substrate;
   (b) a platform supported above the substrate by a trio of flexible members;
   (c) a plurality of fuses anchoring the platform to the substrate during fabrication thereof, with each fuse being electrically severable to release the platform for movement; and
   (d) means for bending each flexible member, thereby changing the elevation or tilt of the platform.

23. The apparatus of claim 22 wherein each fuse comprises polycrystalline silicon.

24. A microelectromechanical apparatus, comprising:
   (a) a substrate;
   (b) a platform supported above the substrate by a plurality of flexible members, with each flexible member being attached to the platform at a point between a central axis of the platform and the periphery of the platform; and
   (c) a plurality of electrostatic actuators providing movement in a direction substantially in the plane of the substrate, with each electrostatic actuator being operatively connected to one of the flexible members to bend the flexible member out of the plane of the substrate, thereby elevating or tilting the platform.

25. The apparatus of claim 24 further including a mirror coating on the platform for reflecting an incident light beam.

26. A microelectromechanical apparatus, comprising:
   (a) a substrate;
   (b) a platform formed on the substrate and having a central axis oriented at an angle to the plane of the substrate;
   (c) a plurality of compliant members, each connected at a first end thereof to an underside of the platform, with the plurality of compliant members further being arranged symmetrically about the central axis;
   (d) a plurality of elongate flexible members, each connected at an inner end thereof to a second end of one of the compliant members, with an outer end of each elongate flexible member being operatively connected to an electrostatic actuator; and
   (e) at least one elongate elevation member connecting each flexible member to the substrate, with each elevation member acting in combination with the flexible member to which the elevation member is connected to elevate or tilt the platform in response to a force provided on the outer end of the flexible member by the electrostatic actuator.

27. The apparatus of claim 26 wherein the substrate comprises silicon.

28. The apparatus of claim 26 wherein the platform is circular or polygonal.

29. The apparatus of claim 26 wherein the platform includes a stress compensation coating formed thereon.

30. The apparatus of claim 26 wherein the platform includes a mirror coating on a surface thereof.

31. The apparatus of claim 30 wherein the other surface of the platform includes a stress-compensation coating formed thereon.

32. The apparatus of claim 26 wherein the plurality of flexible members comprises a trio of flexible members.

33. The apparatus of claim 26 further including a plurality of pre-stressed members located beneath the platform, with each pre-stressed member being anchored at one end thereof to the substrate, and with the other end of each pre-stressed member providing an upward-directed force on the underside of the platform to urge the platform upward from the substrate.

34. The apparatus of claim 33 wherein each pre-stressed member is elongate and is oriented radially outward along a line from the central axis.

35. The apparatus of claim 26 further including a plurality of polysilicon fuses for securing the platform to the substrate, with each fuse being electrically severable to release the platform for movement.

36. The apparatus of claim 26 further including a plurality of restraining clips for securing the platform to the substrate, with each restraining clip being removable to release the platform for movement.

37. A microelectromechanical apparatus, comprising:
   (a) a substrate;
   (b) a platform supported above the substrate by a plurality of elongate flexible members;
   (c) at least one elevation member connected at one end thereof to each flexible member, with the other end of the elevation member being anchored to the substrate through a flexible joint; and
   (d) an electrostatic actuator operatively connected to the other end of each flexible member to provide a force to the flexible member, thereby bending the flexible member and elevatating or tilting the platform.

38. The apparatus of claim 37 wherein the flexible members are spaced by an angle of 120 degrees about a central axis of the platform.

39. The apparatus of claim 37 wherein each flexible member supports the platform by a compliant member which connects the flexible member to the platform.

40. The apparatus of claim 37 wherein the plurality of elongate flexible members comprises two or three flexible members.

41. The apparatus of claim 37 wherein one side of the platform is anchored to the substrate by a flexible hinge.

42. The apparatus of claim 37 wherein the platform includes a mirror coating on a topside thereof.

* * * * *